United States Patent
Kumar et al.

(10) Patent No.: US 10,523,245 B2
(45) Date of Patent: *Dec. 31, 2019

(54) SOFT DECODER FOR GENERALIZED PRODUCT CODES

(71) Applicant: SK Hynix Inc., Gyeonggi-do (KR)

(72) Inventors: Naveen Kumar, San Jose, CA (US); Aman Bhatia, San Jose, CA (US); Yi-Min Lin, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/460,155

(22) Filed: Mar. 15, 2017

(65) Prior Publication Data
US 2017/0279468 A1 Sep. 28, 2017

Related U.S. Application Data

(60) Provisional application No. 62/312,353, filed on Mar. 23, 2016.

(51) Int. Cl.
*H03M 13/00* (2006.01)
*H03M 13/29* (2006.01)
*H03M 13/45* (2006.01)
*H03M 13/15* (2006.01)

(52) U.S. Cl.
CPC ... *H03M 13/6502* (2013.01); *H03M 13/2909* (2013.01); *H03M 13/2942* (2013.01); *H03M 13/2963* (2013.01); *H03M 13/2978* (2013.01); *H03M 13/453* (2013.01); *H03M 13/152* (2013.01)

(58) Field of Classification Search
CPC ......... H03M 13/2909; H03M 13/6502; H03M 13/152; H03M 13/453; H03M 13/2963; H03M 13/2978; H03M 13/2942
See application file for complete search history.

(56) References Cited

U.S. PATENT DOCUMENTS

| | | | |
|---|---|---|---|
| 4,617,664 A | 10/1986 | Aichelmann et al. |
| 5,477,551 A | 12/1995 | Parks et al. |
| 5,517,514 A | 5/1996 | Norrie et al. |
| 6,047,395 A | 4/2000 | Zook |
| 6,052,815 A | 4/2000 | Zook |
| 7,356,752 B2 | 4/2008 | Hewitt et al. |

(Continued)

OTHER PUBLICATIONS

"The abc of linear block codes," Sklar et al.; IEEE, Jul. 2004.*

(Continued)

*Primary Examiner* — Guy J Lamarre
(74) *Attorney, Agent, or Firm* — Kilpatrick Townsend & Stockton LLP

(57) ABSTRACT

A memory device includes a memory array, a processor, and a decoding apparatus. The processor is coupled to the memory array and configured to read encoded data from the memory array. The encoded data includes a plurality of data blocks and each data block is included in two or more data codewords. Further, data codewords belonging to a same pair of data codewords share a common data block. The decoding apparatus is configured to iteratively decode data codewords using hard decoding and soft decoding, and to correct stuck errors by identifying failed data blocks based on shared blocks between failed data codewords.

10 Claims, 17 Drawing Sheets

(56) References Cited

U.S. PATENT DOCUMENTS

| | | | |
|---|---|---|---|
| 8,156,400 B1 | 4/2012 | Yeo et al. | |
| 8,429,498 B1 | 4/2013 | Anholt et al. | |
| 8,468,430 B2 | 6/2013 | Shin | |
| 8,887,020 B2 | 11/2014 | Shokrollahi | |
| 9,231,623 B1 | 1/2016 | Kumar | |
| 9,559,727 B1 | 1/2017 | Kumar et al. | |
| 9,998,148 B2 | 6/2018 | Lin et al. | |
| 2001/0050622 A1 | 12/2001 | Hewitt et al. | |
| 2002/0007474 A1* | 1/2002 | Fujita | H03M 13/2957 714/755 |
| 2004/0025106 A1 | 2/2004 | Massey | |
| 2004/0054651 A1 | 3/2004 | Katayama et al. | |
| 2008/0134004 A1 | 6/2008 | Park et al. | |
| 2010/0088575 A1 | 4/2010 | Sharon et al. | |
| 2010/0199149 A1 | 8/2010 | Weingarten et al. | |
| 2011/0258514 A1* | 10/2011 | Lasser | G06F 11/1012 714/763 |
| 2012/0317460 A1* | 12/2012 | Chilappagari | G06F 11/1048 714/773 |
| 2014/0095960 A1 | 4/2014 | Chu et al. | |
| 2014/0129896 A1 | 5/2014 | Parthasarathy | |
| 2014/0129899 A1 | 5/2014 | Kumar | |
| 2015/0309869 A1* | 10/2015 | Mittelholzer | G06F 11/1012 714/764 |
| 2015/0309875 A1 | 10/2015 | Mittelholzer | |
| 2016/0142075 A1 | 5/2016 | Maehata | |
| 2016/0285478 A1 | 9/2016 | Fujiwara | |
| 2016/0342467 A1 | 11/2016 | Kumar et al. | |
| 2017/0222662 A1* | 8/2017 | Kumar | H03M 13/2927 |
| 2017/0257121 A1 | 9/2017 | Kwok | |
| 2017/0331500 A1* | 11/2017 | Bhatia | H03M 13/2942 |
| 2017/0373706 A1* | 12/2017 | Lin | H03M 13/2909 |

OTHER PUBLICATIONS

Jord Justesen, "Performance of Product Code and Related Structures with Iterated Decoding" IEEE Transactions on Communication, vol. 59, No. 2, Feb. 2011, 9 pages.

Final Office Action for U.S. Appl. No. 15/158,425 dated Oct. 15, 2018, 9 pages.

Non-Final Office Action for U.S. Appl. No. 15/158,425 dated Mar. 21, 2018, 12 pages.

Notice of Allowance for U.S. Appl. No. 15/158,425 dated Dec. 18, 2018, 5 pages.

Non-Final Office Action for U.S. Appl. No. 15/411,773 dated Oct. 30, 2018, 36 pages.

Non-Final Office Action for U.S. Appl. No. 15/582,278 dated Sep. 20, 2018, 11 pages.

Non-Final Office Action for U.S. Appl. No. 15/668,565 dated Jan. 11, 2019, 11 pages.

Fijo Therattil and Andrew Thangaraj "A Low-complexity Soft-decision Decoder for Extended BCH and RS-Like Codes," in Proc. IEEE Int. Symp. Inf. Theory, Sep. 2005, pp. 1320-1324.

U.S. Appl. No. 15/411,773, "Notice of Allowance", dated May 28, 2019, 17 pages.

U.S. Appl. No. 15/582,278, "Final Office Action", dated Apr. 18, 2019, 16 pages.

U.S. Appl. No. 15/668,565, "Ex Parte Quayle Action", May 1, 2019, 6 pages.

U.S. Appl. No. 15/158,425, "Notice of Allowance", dated Apr. 19, 2019, 5 pages.

* cited by examiner

SOFT DECODER FOR GENERALIZED PRODUCT CODES

CROSS-REFERENCES TO RELATED APPLICATIONS

The present application claims priority to U.S. Provisional Application No. 62/312,353, entitled "Soft Decoder Architecture For Generalized Product Codes," filed Mar. 24, 2016, commonly owned and expressly incorporated by reference herein in its entirety.

This application is related to U.S. patent application Ser. No. 15/158,425 entitled "Generalized Product Codes For NAND Flash Storage," filed May 18, 2016, and U.S. Provisional Application No. 62/290,749, entitled "Data Dependency Mitigation In Decoder Architecture For Generalized Product Codes," filed Jan. 20, 2017, both of which are commonly assigned and expressly incorporated by reference herein in their entirety.

BACKGROUND

The term "error correcting code (ECC)" is used herein to refer to a process of adding redundant data, or parity data, to a message, such that it can be recovered by a receiver even when a number of errors were introduced, either during the process of transmission, or storage. In general, the ECC can correct the errors up to the capability of the code being used. Error-correcting codes are frequently used in communications, as well as for reliable storage in media such as CDs, DVDs, hard disks, and random access memories (RAMs), flash memories, solid state disk (SSD), and the like.

In NAND flash storage enterprise applications, high read throughput is a key requirement. Read latency can be reduced significantly if the ECC decoder is able to decode the data using a single read from the NAND media (hard decoding). This motivated the ECC researchers to improve performance for the hard decoding. With recent research findings for product codes, it has been confirmed that this class of codes provides better decoding performance compared to Bose-Chaudhuri-Hocquenghem (BCH) and low density parity check (LDPC) codes with a low complexity encoder/decoder when a single NAND read operation is performed.

A class of improved product codes have been proposed, as described in U.S. patent application Ser. No. 15/158,425 entitled "Generalized Product Codes For NAND Flash Storage," filed May 18, 2016, which is commonly assigned and expressly incorporated by reference herein in its entirety. This class of improved product codes, referred to as generalized product codes (GPC), has been shown to provide improved performance, for example, lower error floor.

BRIEF SUMMARY

Unlike turbo product codes, GPCs have a structure such that every pair of constituent codewords share a certain number of data bits among each other (referred to as intersection of these codewords). Hard decision decoding algorithms have been proposed for improving performance of these codes. However, soft decoding of product codes has not received enough attention. If existing soft decoders for conventional product codes are used for GPC, there is still a huge performance gap from the channel capacity that can be reduced by finding a better soft decoding architecture.

In embodiments of the present disclosure, a decoder is iterative and uses Chase decoding on constituent codewords and parity-on-parity (POP) codewords along with an error location estimate (ELE) block. In some embodiments, the codewords can include XOR blocks which are formed by "exclusive OR" operation on a plurality of information bits, and the decoder can use XOR block information in flipping error bits while decoding the codeword using miscorrection avoidance thresholding (MAT). As described further below, MAT can be used during decoding with flipped bits to avoid miscorrections. The bit flipping using XOR information and MAT to bolster the Chase iterative decoding can make the codeword decoding faster and more efficient.

Note that the terms "block" and "chunk" are used interchangeably, as are "data block" and "data chunk," "block of data bits, information bits, parity bits" and "chunk of data bits, information bits, parity bits," etc.

According to some embodiments of the present disclosure, a decoding apparatus configured for decoding a plurality of codewords includes a memory, one or more decoders, a processor coupled to the decoders and the memory, and the processor is configured to read encoded data from the memory. The encoded data includes a group of data bits arranged in data blocks, the data blocks including information blocks of information bits and one or more XOR blocks of XOR bits, the XOR bits formed by exclusive OR operation on a plurality of information bits. The encoded data includes a plurality of data codewords, each data codeword includes a number of data blocks and a parity block having a number of parity bits, and the parity bits are formed by encoding the data blocks using a first error-correcting coding scheme. The encoded data further includes multiple parity-on-parity (POP) codewords formed by encoding the parity bits of the data codewords using a second error-correcting coding scheme. Each data block is included in two or more data codewords, and data codewords belonging to the same pair of data codewords share a common data block. The decoding apparatus is configured to iteratively decode the data codewords and the POP codewords. The decoding apparatus is also configured to correct stuck errors in the data blocks by identifying failed data blocks based on shared blocks between failed data codewords and identifying failed bits in failed data blocks using information from the XOR blocks of XOR bits. The decoding apparatus is also configured to correct stuck errors in the parity blocks by identifying failed parity blocks based on failed data codewords and failed POP codewords.

In an embodiment of the above decoding apparatus, the apparatus is configured to iteratively decode the data codewords and the POP codewords by first hard decoding of the data codewords and the POP codewords, soft decoding of the data codewords, second hard decoding of the data codewords and the POP codewords, and soft decoding of the POP codewords.

In another embodiment, the apparatus is configured to iteratively decode the data codewords and the POP codewords with miscorrection avoidance thresholding (MAT).

In another embodiment, the apparatus is configured to decode the data codewords and the POP codewords repeatedly until the plurality of codewords are successfully decoded, until a first predetermined number of iterations has been reached, or until stuck errors are identified when syndromes of the data codewords have not changed from a previous iteration.

In another embodiment, the soft decoding of the data codewords comprises performing Chase decoding of the data codewords with miscorrection avoidance thresholding (MAT).

In another embodiment, the soft decoding of the POP codewords comprises performing Chase decoding of the POP codewords with miscorrection avoidance thresholding (MAT).

In another embodiment, correcting stuck errors in the data blocks includes determining a list of failed data codewords by including, in the list, those data codewords having more corrections than allowed by a restricted error correction capability of the first error-correcting coding scheme, identifying potential failed data blocks based on shared blocks between failed data codewords, and identifying potential failed bits in failed data blocks using information from the blocks of XOR bits.

In another embodiment, correcting stuck errors in the data blocks further includes flipping one or more potential failed bits and performing decoding using the first error-correcting coding scheme miscorrection avoidance thresholding (MAT).

In another embodiment, correcting stuck errors in the POP blocks includes determining a list of failed pop codewords by including those POP codewords having more corrections than a restricted error correction capability of the second error-correcting coding scheme, and identifying potential failed parity blocks based on failed data codewords and failed POP codewords.

In another embodiment, correcting stuck errors in the POP blocks further includes flipping one or more bits in the potential failed parity blocks and performing decoding using the second error-correcting coding scheme with miscorrection avoidance thresholding (MAT).

According to some embodiments of the present disclosure, a memory device includes a memory array, a processor, and a decoding apparatus. The processor is coupled to the memory array and configured to read encoded data from the memory array. The encoded data includes a plurality of data blocks and each data block is included in two or more data codewords. Further, data codewords belonging to a same pair of data codewords share a common data block. The decoding apparatus is configured to iteratively decode the data codewords using hard decoding and soft decoding, and correct stuck errors by identifying failed data blocks based on common data blocks between failed data codewords in the iterative decoding.

In an embodiment of the above memory device, the encoded data includes a group of data bits arranged in data blocks, the data blocks including information blocks of information bits and one or more XOR blocks of XOR bits, the XOR bits formed by exclusive OR operation on the information bits. The encoded data also includes a plurality of data codewords. Each data codeword includes a number of data blocks and a parity block having a number of parity bits, and the parity bits are formed by encoding the data blocks using a first error-correcting coding scheme. The encoded data also includes multiple parity-on-parity (POP) codewords formed by encoding the parity bits of the data codewords using a second error-correcting coding scheme.

In another embodiment, the decoding apparatus is configured to iteratively decode the data codewords by first hard decoding of the data codewords and the POP codewords, soft decoding of the data codewords, second hard decoding of the data codewords and the POP codewords, and soft decoding of the POP codewords.

In another embodiment, the decoding apparatus is configured to correct stuck errors by correcting stuck errors in the data codewords by identifying failed data blocks based on shared blocks between failed data codewords, and identifying failed bits in the failed data blocks using information from the blocks of XOR bits. The decoding apparatus is also configured for correcting stuck errors in the POP codewords by identifying failed parity blocks based on failed data codewords and failed POP codewords.

In another embodiment, correcting stuck errors in the data blocks includes determining a list of failed data codewords by including, in the list, those data codewords having more corrections than allowed by a restricted error correction capability of the first error-correcting coding scheme, identifying potential failed data blocks based on shared blocks between failed data codewords, identifying potential failed bits in failed data blocks using information from the blocks of XOR bits, and flipping one or more potential failed bits.

In another embodiment, correcting stuck errors in the POP blocks includes determining a list of failed POP codewords by including, in the list, those POP codewords having more corrections than allowed by a restricted error correction capability of the second error-correcting coding scheme, identifying potential failed parity blocks based on failed data codewords and failed POP codewords, and flipping one or more potential failed bits According to some embodiments of the present disclosure, a method for decoding data includes reading encoded data from a memory array. The encoded data is a plurality of data blocks and each data block is included in two or more data codewords, wherein data codewords belonging to a same pair of data codewords share a common data block. The method also includes iteratively decoding the data codewords using hard decoding and soft decoding, and correcting stuck errors by identifying failed data blocks based on common data blocks between failed data codewords.

In an embodiment of the above method, the encoded data includes a group of data bits arranged in data blocks, the data blocks including information blocks of information bits and one or more XOR blocks of XOR bits, the XOR bits formed by exclusive OR operation on the information bits. The encoded data also includes a plurality of data codewords, each data codeword includes a number of data blocks and a parity block having a number of parity bits, and the parity bits are formed by encoding the data blocks using a first error-correcting coding scheme. The encoded data also includes multiple parity-on-parity (POP) codewords formed by encoding the parity bits of the data codewords using a second error-correcting coding scheme.

In another embodiment, iteratively decoding data codewords includes first hard decoding of the data codewords and the POP codewords, soft decoding of the data codewords, second hard decoding of the data codewords and the POP codewords, and soft decoding of the POP codewords.

In another embodiment, the method also includes correcting stuck errors in the data codewords by identifying failed data blocks based on shared blocks between failed data codewords, and identifying failed bits in the failed data blocks using information from the blocks of XOR bits. The method also includes correcting stuck errors in the POP codewords by identifying failed parity blocks based on failed data codewords and failed POP codewords.

In another embodiment, correcting stuck errors in the data blocks includes determining a list of failed data codewords by including those data codewords having more corrections than a restricted error correction capability of the first error-correcting coding scheme, identifying potential failed data blocks based on shared blocks between failed data codewords, identifying potential failed bits in failed data blocks using information from the blocks of XOR bits, and flipping one or more potential failed bits.

In another embodiment, correcting stuck errors in the POP blocks includes determining a list of failed POP codewords by including those POP codewords having more corrections than a restricted error correction capability of the second error-correcting coding scheme, identifying potential failed parity blocks based on failed data codewords and failed POP codewords, and flipping one or more potential failed bits.

Further details of the nature and advantages of the present disclosure are described below with reference to the remaining portions of the specification and the drawings.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1A:
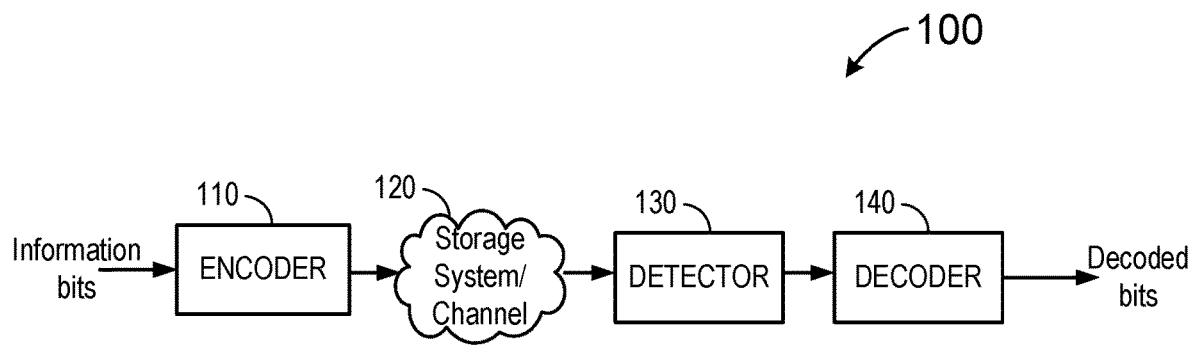
FIG. 1A is a simplified block diagram illustrating a data communication system in accordance with certain embodiments of the present disclosure.

FIG. 1A a simplified block diagram illustrating a data communication system 100 in accordance with certain embodiments of the present disclosure. In the example shown, encoder 110 receives information bits that include data which is desired to be stored in a storage system 120 or transmitted in a communications channel. The encoded data is output by encoder 110 and is written to storage 120. In various embodiments, storage 120 may include a variety of storage types or media such as (e.g., magnetic) disk drive storage, Flash storage, etc. In some embodiments, the techniques described herein are employed in a transceiver and instead of being written to or read from storage, the data is transmitted and received over a wired and/or wireless channel. In this case, the errors in the received codeword may be introduced during transmission of the codeword.

When the stored data is requested or otherwise desired (e.g., by an application or user which stored the data), detector 130 receives the data from the storage system. The received data may include some noise or errors. Detector 130 performs detection on the received data and outputs decision and/or reliability information corresponding to one or more bits in a codeword. For example, a soft-output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

The decision and/or reliability information is passed to decoder 140 which performs decoding using the decision and reliability information. A soft input decoder utilizes both the decision and the reliability information to decode the codeword. A hard decoder utilizes only the decision values in the decoder to decode the codeword. After decoding, the decoded bits generated by the decoder are passed to the appropriate entity (e.g., the user or application which requested it). With proper encoding and decoding, the information bits match the decoded bits.

Figure 1B:
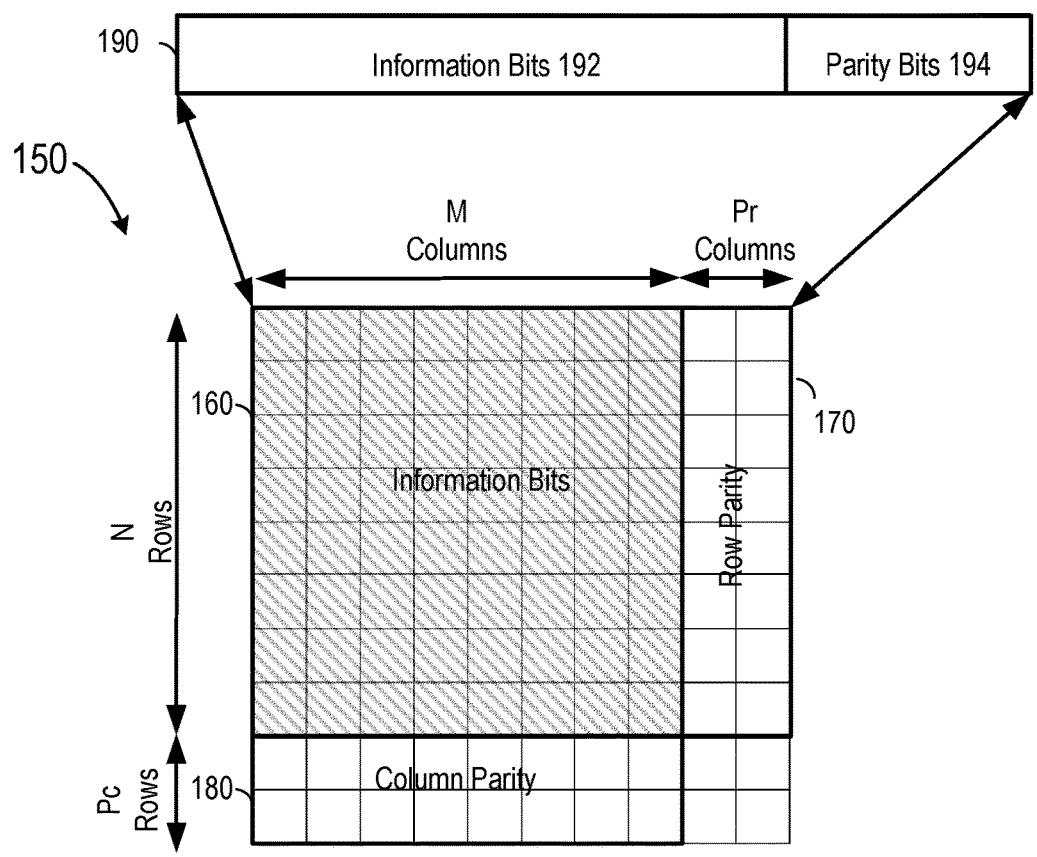
FIG. 1B is a simplified block diagram illustrating a conventional product code.

FIG. 1B a simplified block diagram illustrating a conventional product code. FIG. 1B illustrates a two-dimensional turbo product code (TPC) codeword 150. As illustrated, the TPC codeword 150 may be a matrix of size $(N+P_c) \times (M+P_r)$, in which N represents the number of rows of information bits, M represents the number of columns of information bits, $P_r$ represents the number of row parity bits and $P_c$ represents the number of column parity bits. Information bits can be represented by a matrix of size N×M (e.g., matrix 160), row parity bits can be represented by a matrix of size N×$P_r$ (e.g., matrix 170), and Column parity bits may be represented by a matrix of size $P_c$×M (e.g., matrix 180). The TPC codeword may include N row codewords and M column codewords. Each row codeword 190 includes multiple information bits 192 and one or more parity bits 194. Similarly, each column codeword includes multiple information bits and one or more parity bits. As an example, if row constituent code is a BCH code, the row codewords 1 through N are constructed using BCH encoding. Similarly, column codewords 1 through M are generated using an error correcting constituent code (e.g., BCH code, Reed Solomon code, etc.).

As an example, if the row constituent code has a code rate of 0.9, the row codeword may include 90 information bits and 10 parity bits. In general, row codewords and column codewords may have any code rate, without departing from the teachings of the present disclosure. To obtain the row and column parity bits, a TPC encoder (not shown) first encodes the N rows of information bits (shown as shaded blocks) to generate the N row parity bit groups. Then, the TPC encoder encodes the M columns of information bits to generate the M column parity bit sets.

Figure 2A:
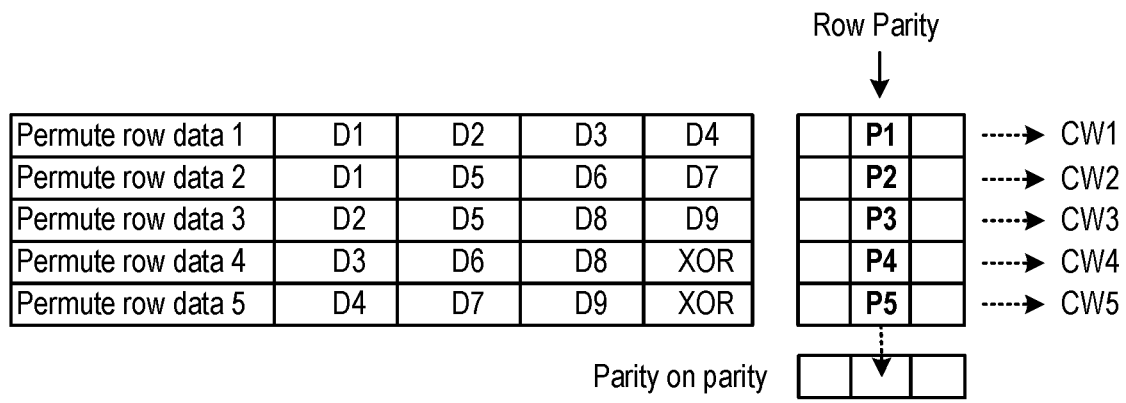
FIG. 2A is a simplified block diagram illustrating a generalized product code (GPC) in accordance with certain embodiments of the present disclosure.

FIGS. 2A-2H are simplified schematic diagrams illustrating a generalized product code (GPC) in accordance with certain embodiments of the present disclosure. As an example, a GPC is a product code in which information bits are grouped in blocks, the blocks of information bits and one or more XOR parity blocks arranged in a rectangular matrix of data blocks. In the example of FIG. 2A, the data blocks of information bits, also referred to as information blocks, are numbered D1-D9, and each block Dk contains I bits, where I is a positive integer. Each row of data is permuted and the codeword parity is constructed on the permuted data, which is shown as Row Parity in FIG. 2A. In addition, the parities on the parity (POP) are constructed by combining row parities column-wise. The arrangement is configured to remove miscorrections because the same codeword will not be formed for different rows with changing data locations with permutations. All the data blocks are protected twice, however the row parity is protected once. The parity on parity (POP) will add another level of protection to remove errors in parities.

Figure 2B:
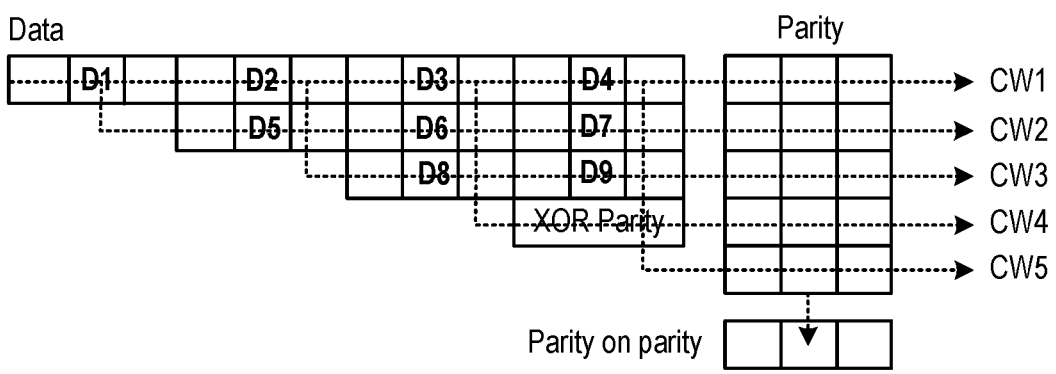
FIG. 2B is a simplified block diagram illustrating an exemplary construction of a generalized product code (GPC) in accordance with certain embodiments of the present disclosure.

In FIG. 2B, a specific example is shown to explain the construction of a GPC. However, the method described here can be used for any class of generalized product codes. For example, in other embodiments, the product code construction can be extended to higher dimensions. In an embodiment, data blocks can be protected three times in a three-dimensional generalized product code. In FIG. 2B, the number of data bits in a block, I, is taken as an integer, for example, from 8 to 16, but it can be any chosen value depending upon desired data length and code rate. Let Ncw be the number of row codewords, which is equal to five in FIG. 2B, i.e., there are five codewords designated as CW1-CW5. The block designated as "XOR" or "XOR parity" is constructed by taking XOR (exclusive OR) of all data blocks of length I, and the parities of the first (Ncw−1) row codewords. In some embodiments, multiple XOR blocks can be formed, with each XOR block constructed based on a subset of all data blocks of information bits. The length of the "XOR parity" block is also equal to I. All row parities are further encoded by another constituent code which is called parity on parity or POP. In this code construction, the decoding criterion is such that the data is decoded successfully if all Ncw codewords are decodable and XOR parity check is satisfied. This decoding criterion helps in avoiding miscorrections which can make a valid codeword in a regular TPC decoding criterion but it will not be a valid codeword with a modified decoding criterion. In this construction XOR is used to correct stuck patterns.

In this example, it can be seen that every pair of constituent codewords share a common block of data bits with each other. In other words, the same block of data is contained in two codewords. For instance, data block D1 is in both CW1 and CW2, and therefore, CW1 and CW2 share data block D1. Similarly, CW1 and CW3 share data block D2, CW1 and CW4 share data block D3, and CW1 and CW4 share data block D4. Further, CW2 and CW3 share data block D5, CW3 and CW4 share data block D8, and CW4 and CW5 share the XOR data block, etc.

Figure 2C:
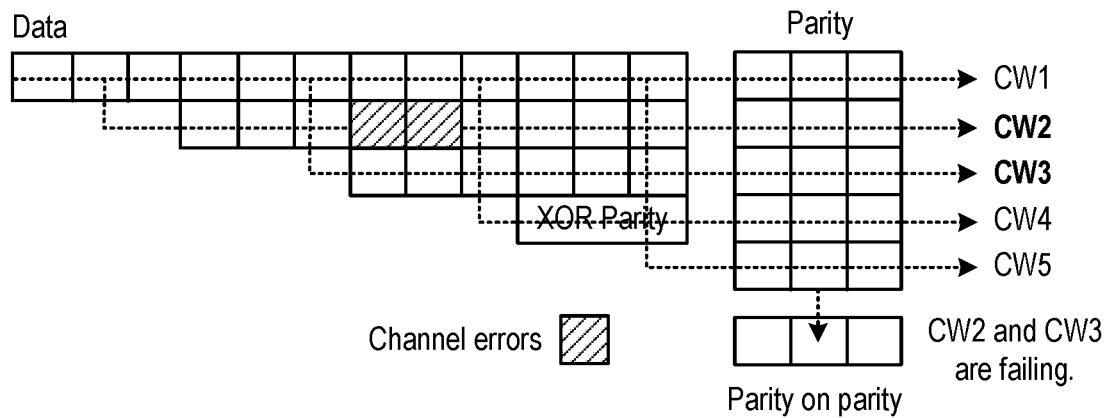
FIGS. 2C-2G are simplified block diagrams illustrating error correction examples in a generalized product code (GPC) in accordance with certain embodiments of the present disclosure.
Figure 2D:
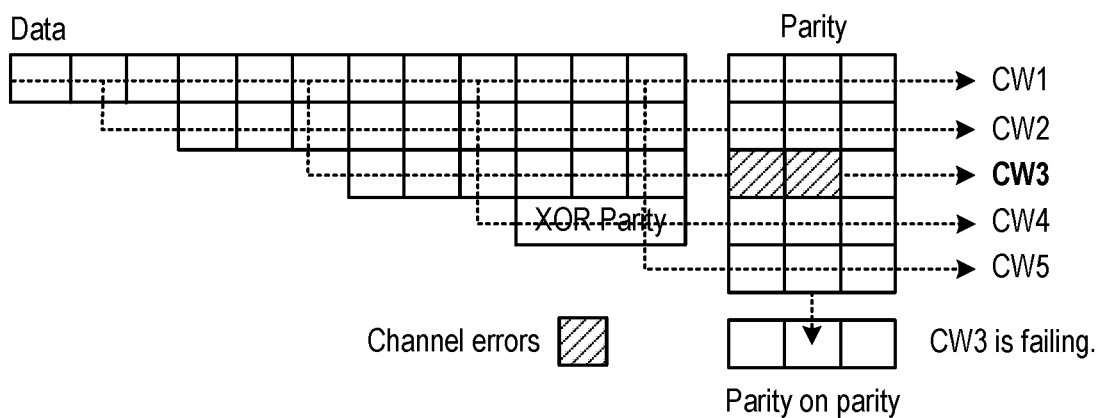
Figure 2E:
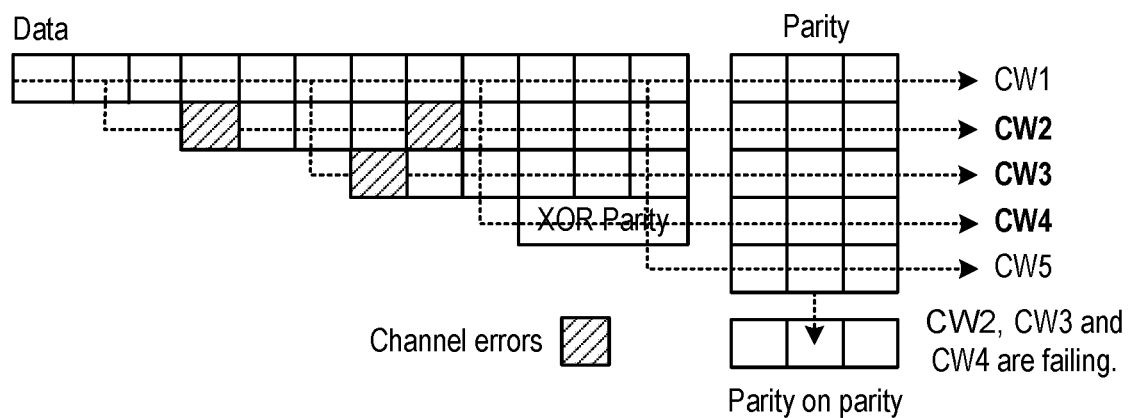
Figure 2F:
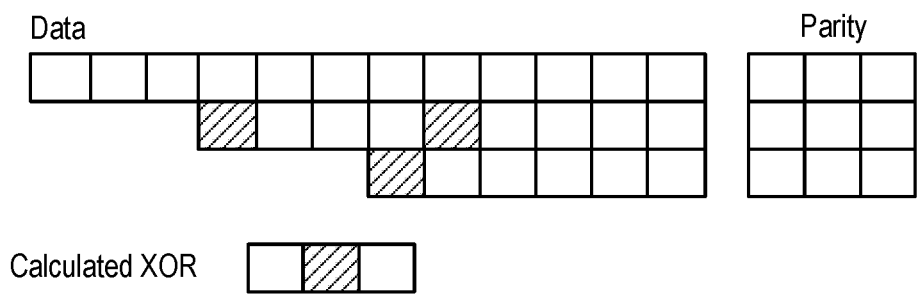
Figure 2G:
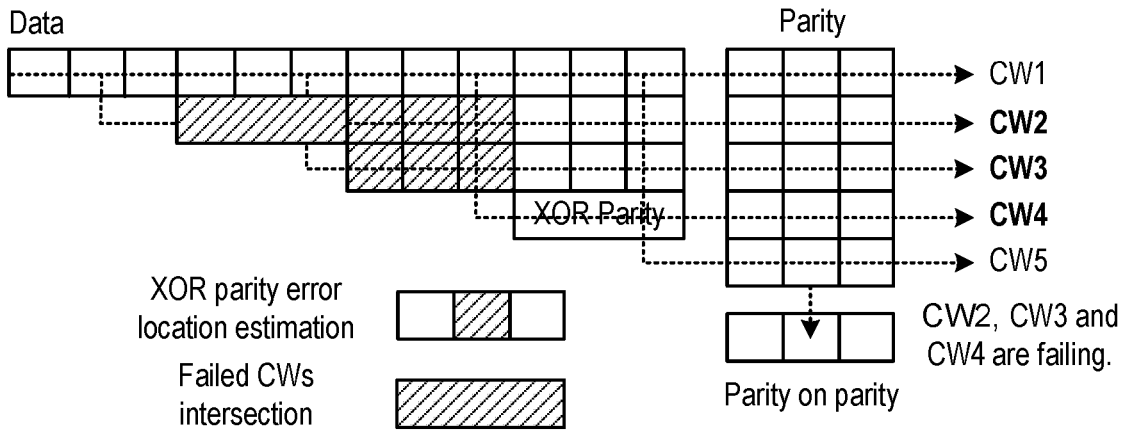

In FIG. 2C, the intersection of two failing codewords is corrected using XOR parity. In this example, the correction capability for constituent codes is assumed to be equal to 1. The stuck pattern shown in FIG. 2D can also be corrected through XOR parity by making correction in parity blocks. The decoding fails when there are three or more codewords failing (see FIG. 2E). The stuck pattern shown in FIG. 2E can be corrected in the following manner. First, the XOR parity is constructed through decoded data as shown in FIG. 2F and compared with XOR parity stored in the data. In this example, calculated XOR parity and stored XOR parity differ at one location which indicates that this is the possible error location (See FIG. 2G). The intersection of all pairs of failed codewords can contain the error at the estimated location. At failed error intersections, the flipping of the estimated bits can be tried and regular decoding can be performed. In this example, flipping in the intersection of CW2 and CW3 will not lead to successful decoding. However, flipping the bit in the intersection of CW2 and CW4 will decode all codewords successfully. In general, the value of I will be much larger than 3, and decoding through XOR parity can provide possible error locations better with large values of I and significantly reduce the number of flips for successful decoding. Let m error locations be provided through XOR parity and there are FI possible error location intersections. Then, 2m bit flips can be tried on those FI intersections to get the successfully decoded data. In general, the XOR parity can also be used to correct errors for the case where there are more than 3 row codewords failing.

Figure 2H:
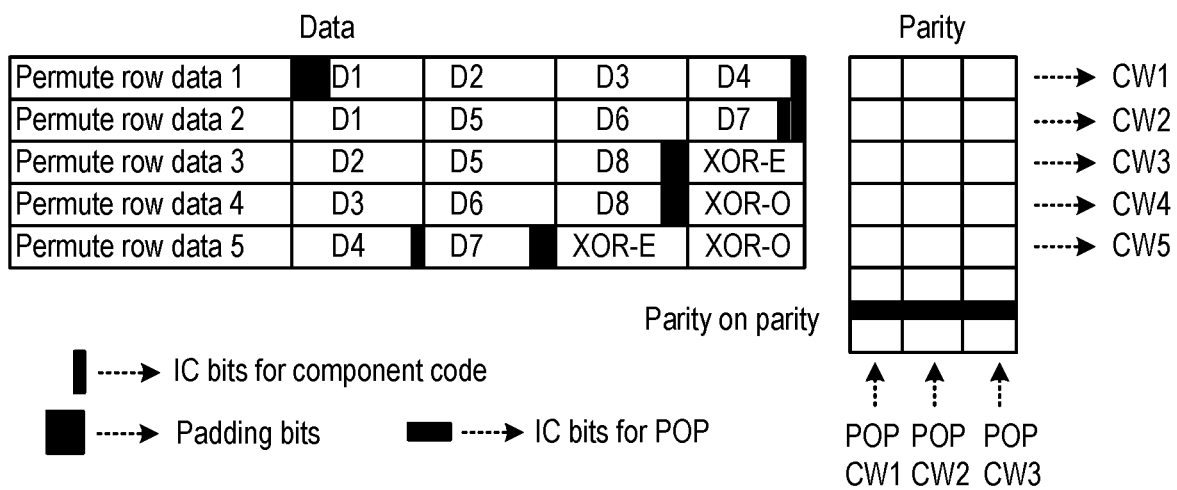
FIG. 2H is a simplified block diagram illustrating another generalized product code (GPC) in accordance with certain embodiments of the present disclosure.

FIG. 2H is a simplified block diagram illustrating another generalized product code (GPC) in accordance with certain embodiments of the present disclosure. Similar to the example of FIG. 2A, data is arranged in an array such that each data chunk or block is protected twice by constituent codes. Each codeword includes multiple data blocks and parity bits. Data blocks can include information blocks (or block of information bits) and XOR blocks or XOR parity blocks, which are blocks formed by an XOR operation of information bits. There is parity on parity (POP) code constructed for constituent code parities. Unlike the GPC in FIG. 2A, which has only one XOR block, the GPC in FIG. 2H has XOR-E and XOR-O, which are parities calculated on all even and odd data chunks respectively and are also protected twice using constituent codes. In FIG. 2H, user data, or information bits, is organized as an array of blocks of length I bits each labeled as D1, D2, ..., D8. Padded zero-bits are shown in black. XOR parity intersections are labeled as XOR-O and XOR-E. Parity bits and IC bits for component codewords and POP codewords are shown [2].

Figure 3A:
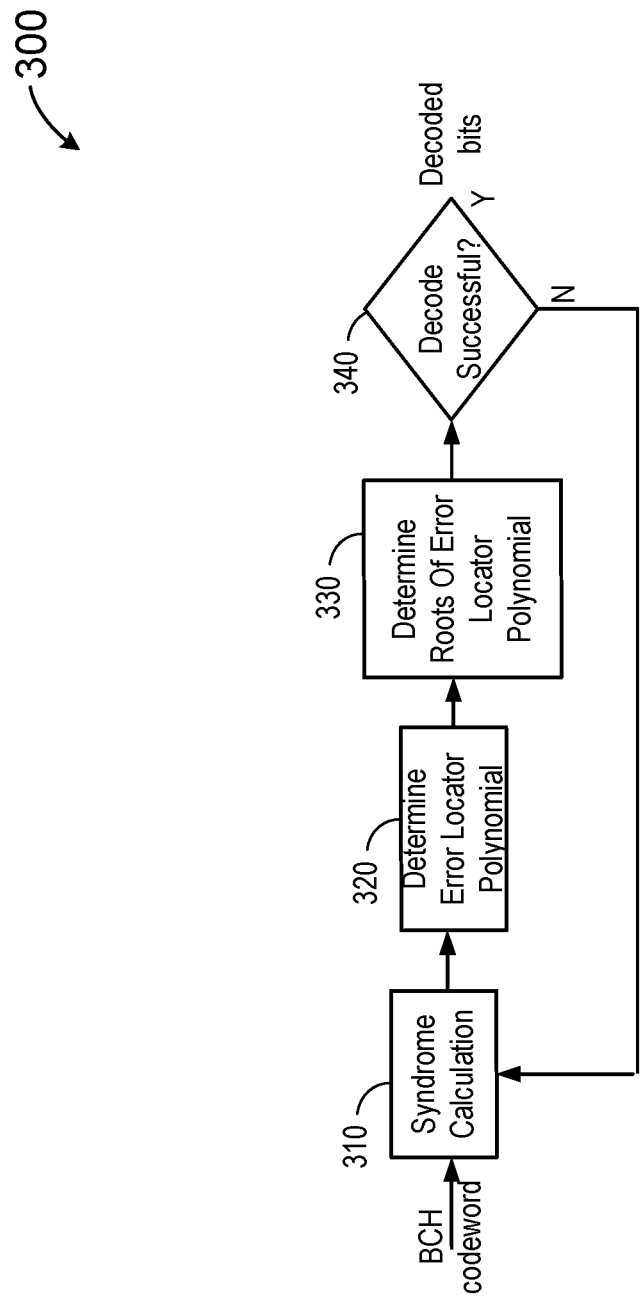
FIG. 3A is a simplified block diagram illustrating an example of a Bose-Chaudhuri-Hocquenghem (BCH) decoder in accordance with certain embodiments of the present disclosure.

In the GPC example described above, the constituent codes are represented by BCH codes. However, other coding schemes can also be used. FIG. 3A is a simplified block diagram illustrating an example of a Bose-Chaudhuri-Hocquenghem (BCH) decoder 300 in accordance with certain embodiments of the present disclosure. As illustrated in FIG. 3A, the decoder receives a BCH codeword and starts an iterative decoding process. For each iteration, the BCH decoder performs syndrome calculation (step 310) on the received codeword, determines error locator polynomial (step 320), and performs Chien search or similar procedures to determine roots of error locator polynomial (step 330). Roots of the error locator polynomial provide an indication of where the errors in the codeword are located. The error locations are used for error correction.

After correcting the errors, at 340, the decoder checks if the decoding process has resulted in a correct codeword. If so, the decoder outputs the decoded bits. Otherwise, the decoder may generate a bit flipping pattern, flipping one or more bits of the codeword based on the pattern and calculate the syndrome values of the new codeword. The decoding process may continue until a correct codeword is found and/or a predetermined maximum number of iterations is reached.

Given the natural numbers m and t, a t-error correcting binary BCH code of length $n=2^m-1$ may be defined as:

$$c(x) \in GF(2)[x]: \deg c(x) \leq n-1, c(\alpha)=c(\alpha^2)=c(\alpha^3)= \ldots = c(\alpha^{2t})=0$$

where $\alpha \in GF(2^m)$ is a primitive element. In other words, it is the set of all binary polynomials of degree at most n−1 such that when these are treated as polynomials over $GF(2^m)$, they must have $\alpha, \alpha^2, \alpha^3, \ldots, \alpha^{2t}$ as their roots.

If c(x) is the transmitted codeword, e(x) is the error polynomial, and R(x)=c(x)+e(x) is the received codeword, then given that $\alpha, \alpha^2, \alpha^3, \alpha^{2t}$ are roots of c(x), an initial component syndrome may be calculated as:

$$S_i = r(\alpha^{i+1}) = e(\alpha^{i+1})$$

for i=0, 1, ..., 2t−1.

The error locator polynomial generator uses the syndromes $S_0, S_1, S_{2t-1}$ to generate the error location polynomial $\Lambda(x)$, which is defined as:

$$\Lambda(x) = \Pi_{i=1}^v (1-\alpha^{j_i} x).$$

Several methods exist in the art for finding the locator polynomial—for example, Berlekamp-Massey algorithm, Peterson's algorithm, and the like. The roots of the error location polynomial (i.e., $j_0, j_1, j_v$ in the equation above) indicate the locations of the errors, so finding the roots of the error location polynomial corresponds to finding the locations of the errors in a corresponding codeword.

Roots of the error location polynomial can be found using Chien search. For binary symbols, once the error locations have been identified, correction simply involves flipping the bit at each identified error location. For non-binary symbols, the error magnitude needs to be calculated, for example, using Forney Algorithm, to find out the magnitude of the correction to be made.

In general, a decoder for product codes may perform BCH decoding on one or more of the row constituent codes and/or column constituent codes iteratively to generate a correct codeword. For GPC, a decoder may perform BCH decoding on one or more of the row constituent codes iteratively to generate a correct codeword.

Figure 3B:
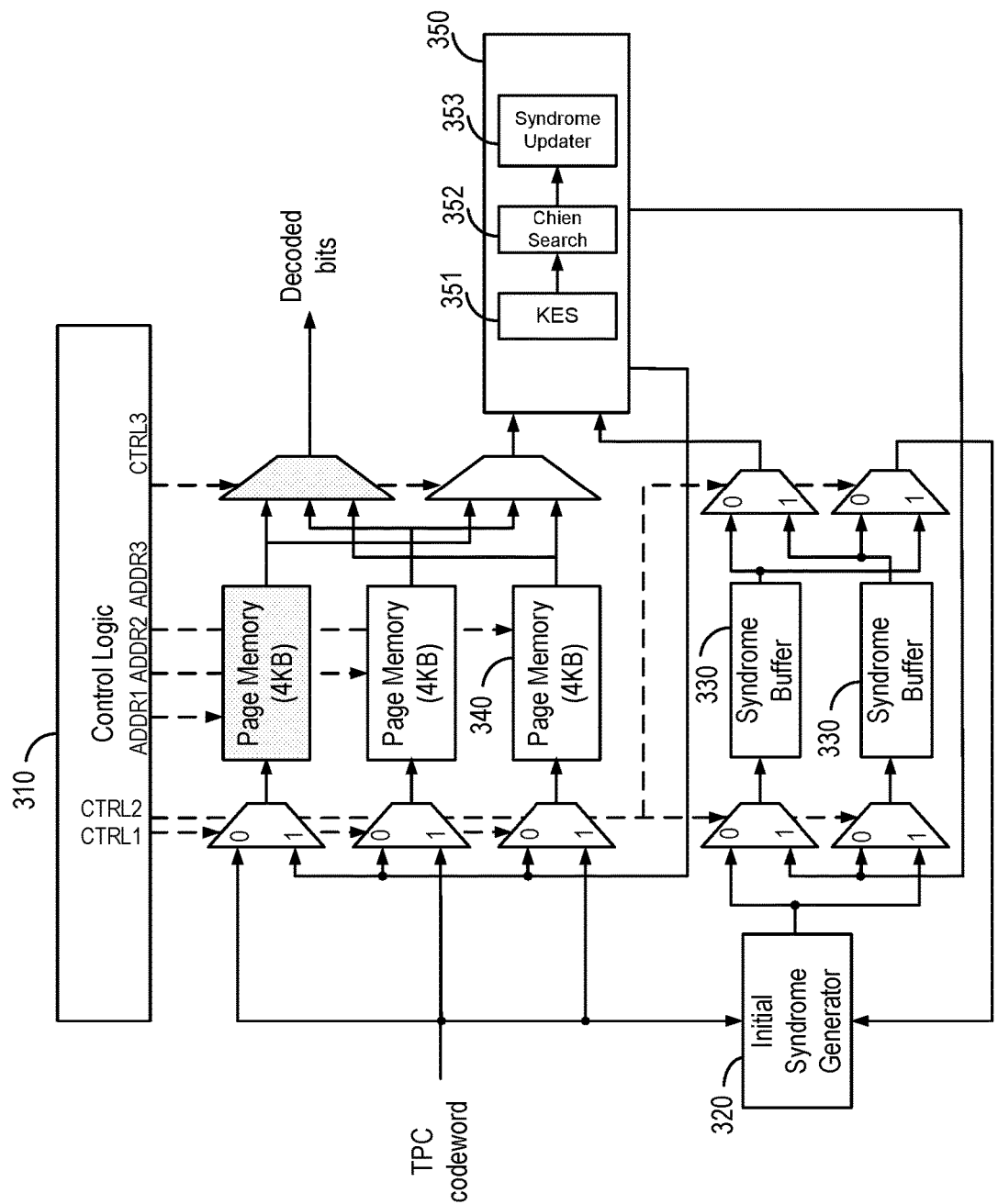
FIG. 3B is a block diagram illustrating a decoder in accordance with certain embodiments of the present disclosure.

FIG. 3B a block diagram illustrating a decoder according to an embodiment. As illustrated, the decoder has a control logic 310, an initial syndrome generator 320, one or more syndrome buffers 330, one or more page memories 340, and decoder 350. The initial syndrome generator is used to generate initial values for the syndromes. For example, after receiving a new codeword, the initial syndrome generator generates one or more syndromes for the decoder and stores them in the syndrome buffers 330. During the decoding procedure, the decoder utilizes the stored syndrome values to decode the codewords and correct errors.

In one embodiment, after finding an error pattern, the decoder corrects the data stored in the memories 340 and also updates the corresponding syndrome values stored in the syndrome buffers 330.

Decoder 350 includes Key equation solver (KES) 351, Chien search 352, syndrome updater 353, and syndrome updater 352. In one embodiment, the syndrome values are calculated by initial syndrome generator 320 to initialize syndrome buffer 330. The decoder reads syndrome values from buffers during decoding iterations. After processing key equation solver (KES) 351 and Chien search 352, the decoder accesses page memory 340 and corrects the data based on the determined error patterns. Some or all of syndrome values are then updated in the syndrome buffer 330.

In one embodiment, the key equation solver is used to carry out the error location polynomial σ(x), which may be defined as follows:

$$\sigma(x)=(1+x\beta_1)(1+x\beta_2) \ldots (1+x\beta_v)=1+\sigma_1 x^1+\sigma_2 x^2+\sigma_3 x^3+\sigma_v x^v.$$

The key equation describing the relation between S(x) and σ(x) may be derived as follows:

$$\Omega(x)=S(x) \times \sigma(x) \bmod x^{2t}$$

where $\Omega(x)$ is the error evaluator polynomial, S(x) represents the syndrome polynomial, and t represents the error correction capability of the code. Two of the popular methods for solving the key equation are Berlekamp-Massey and modified Euclidean algorithms. After the key equation solver, Chien search is applied to find the roots of the error location polynomial σ(x).

Figure 4:
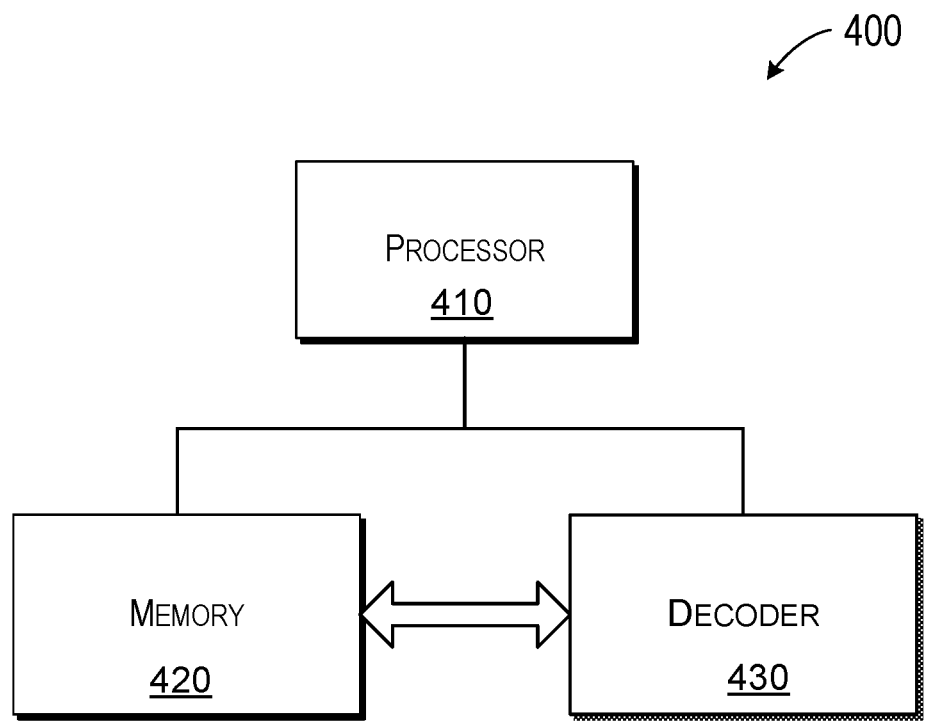
FIG. 4 is a simplified block diagram illustrating a memory device, such as a flash storage in accordance with certain embodiments of the present disclosure.

FIG. 4 is a simplified block diagram illustrating a memory device 400, such as a flash storage, according to an embodiment of the present disclosure. As shown in FIG. 4, memory device 400 includes a processor 410, a memory array 420 coupled to the processor, and a decoding apparatus 430. The decoding apparatus is configured to perform coarse decoding and fine decoding. In coarse decoding, the decoder decodes in parallel two or more codewords, which share a common block of bits, to determine error information. Next, the decoder corrects errors in a first codeword based on the error information. Here, the errors can be corrected at this point, or the errors can be marked for correction. Then, it is determined if the shared common block of data bits is corrected. If the shared common data block is updated, then error correction based on the error information is prohibited in codewords sharing the common block of data bits with the first codeword. In fine decoding, a single codeword is decoded at a time for error correction.

FIG. 4 can also represent a data decoding apparatus configured for decoding a plurality of codewords in parallel. As shown in FIG. 4, decoding apparatus 400 includes processor 410, a memory 420 coupled to the processor, and one or more decoders 430. Processor 410 is configured to read encoded data including a plurality of codewords. The plurality of codewords are encoded in a product code in which each codeword has multiple blocks of data bits and every two codewords share a common block with each other. Examples of the product code is described above in connection with FIGS. 2A-2G. The one or more decoders 430 are configured to perform parallel decoding of two or more codewords.

Figure 5:
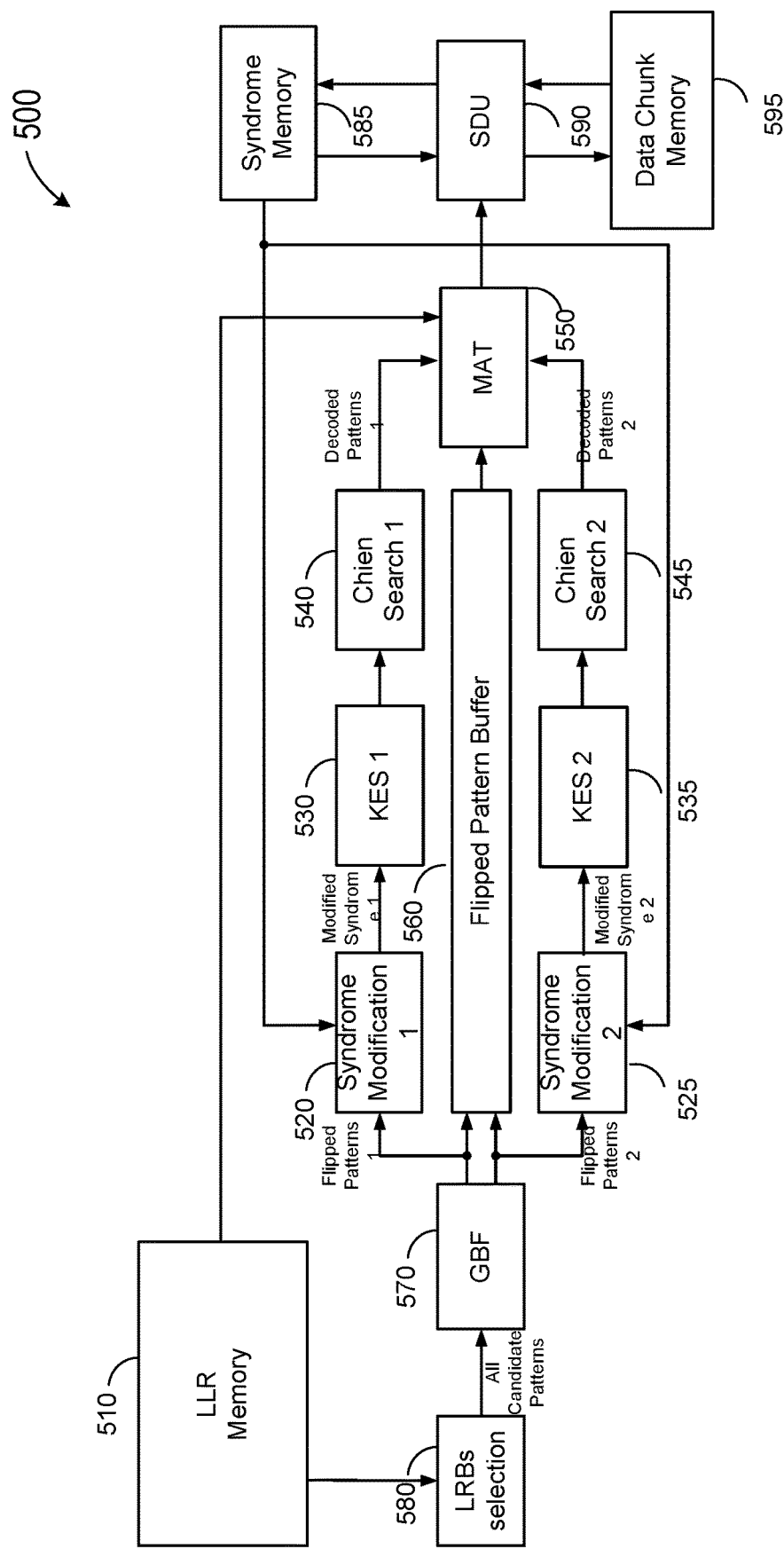
FIG. 5 illustrates an example high-level block diagram of a TPC soft decoder, in accordance with certain embodiments of the present disclosure.

FIG. 5 illustrates an example high-level block diagram of a TPC soft decoder, in accordance with certain embodiments of the present disclosure. The soft decoder can also be used for decoding in GPC as will be described below. In this example, syndrome update-based decoders are utilized. However, in general, any other type of soft decoder for any class of codes could be used without departing from the teachings of the present disclosure.

As illustrated, the decoder includes LLR memory block 510, syndrome modification blocks 520 and 525, key equation solver (KES) blocks 530 and 535, Chien search blocks 540 and 545, miscorrection avoidance (MAT) block 550, syndrome memory 585, syndrome data update (SDU) 590, general bit flipping (GBF) block 570, least reliable bit (LRB) selection block 580 and data chunk memory 595. It should be noted that any of the blocks shown in FIG. 5 could be eliminated and/or modified without departing from the teachings of the present disclosure.

In one embodiment, the LRB selection block 580 selects L least reliable bits based on received LLR values from the bits in the codeword. For example, the LRB selection block may select 10 reliable bits out of 50 received bits. The GBF block 570 may select S bits (S=1, . . . , L) among the L bits to flip. In one example, the GBF block 570 may generate $\Sigma_{i=1}^{i=S} C_i^L$ flipped patterns. As an example, if L=5, S=3, the GBF selects 10 patterns.

In the example TPC soft decoder shown in FIG. 5, two BCH decoders run in parallel. The first BCH decoder includes syndrome modification block 520, KES block 530, and Chien search block 540. The second BCH decoder includes syndrome modification block 525, KES block 535, and Chien search block 545. Therefore, the GBF block 570 generates two flipped patterns each time. It should be noted that any number of serial and/or parallel BCH decoders could be used in the TPC soft decoder, without departing from the teachings of the present disclosure. In case of P parallel decoders, the GBF block may generate P flipped patterns each time. The P flipped patterns may all be different from each other, or some of them may be similar, without departing from the teachings of the present disclosure.

The KES block 530 receives updated syndrome values that are modified based on the flipped patterns and finds error locator polynomial. Chien search 540 is then applied to find roots of error locator polynomial and generate decoded patterns.

In one embodiment, a MAT block 550 is used to reduce the probability of miscorrection by comparing the flipped and decoded patterns with LLR values. If the MAT block 550 detects a miscorrection, the decoded pattern is declared to be in error. If the MAT block does not detect a miscorrection (e.g., MAT condition is passed), the data and syndrome values will be updated according to the flipped and decoded patterns. In one embodiment, updated data value may be written in data chunk memory 595 and an updated syndrome value may be written in syndrome memory 585.

Figure 6:
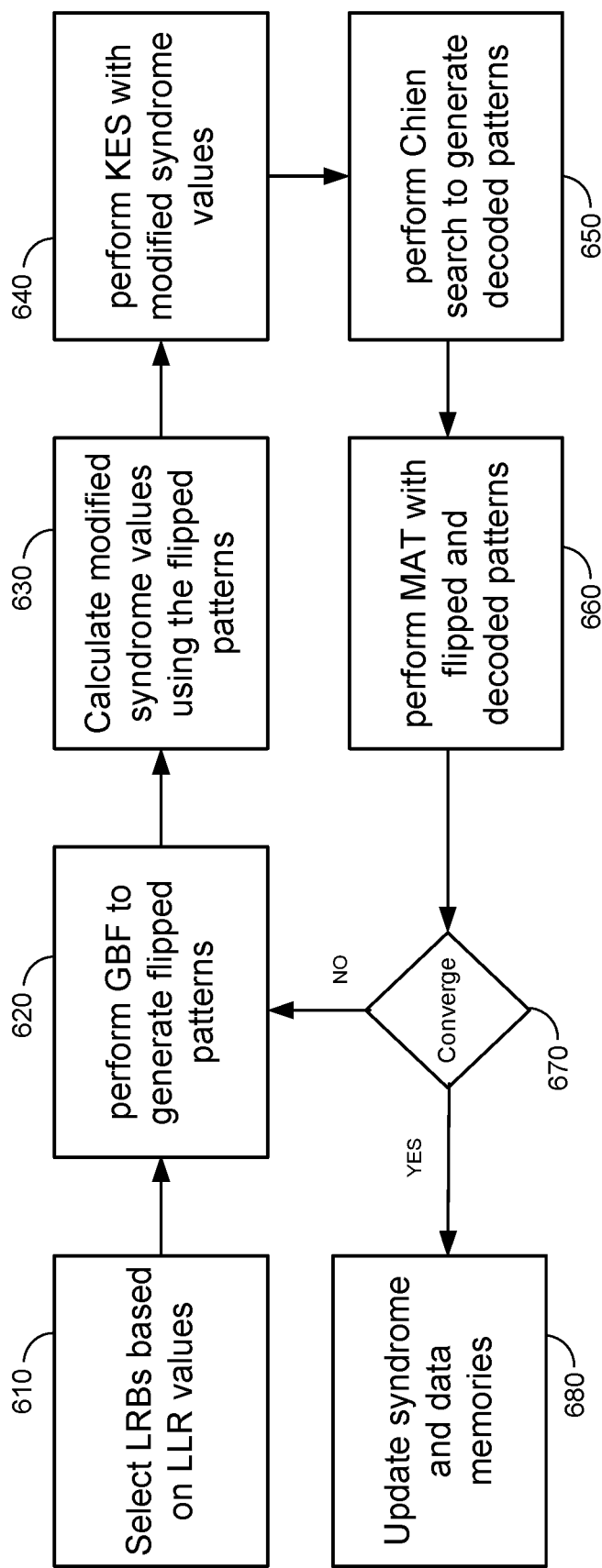
FIG. 6 illustrates example decoding operations that can be performed to decode a TPC codeword, in accordance with certain embodiments of the present disclosure.

An example decoding flow chart corresponding to the TPC soft decoder is illustrated in FIG. 6.

FIG. 6 illustrates example decoding operations that can be performed by a device to decode a TPC codeword, in accordance with certain embodiments of the present disclosure. As illustrated, at 610, the device chooses a plurality of least reliable bits based on the LLR values. at 620, the device generates one or more flipped patterns using the GBF block 570. At 630, the device calculates modified syndrome values based on the one or more flipped patterns. At 640, the device executes the key equation solver using the modified syndrome values to find the error locator polynomial. At 650, the device performs Chien search to generate one or more decoded patterns. At 660, the device performs miscorrection avoidance thresholding with flipped and decoded patterns. At 670, the device checks if the result of the MAT block indicates a correct codeword. If yes, the device updates the syndrome memory and the data memory. If the MAT does not indicate a correct codeword, the device generates another set of flipped patterns using step 620. If the MAT indicates a correct codeword, the device updates the syndrome and data memories (680). In one example, the device may utilize a different set of flipped patterns compared to the previous flipped patterns to execute another iteration of decoding. The device may change any of the decoding parameters in the new iteration without departing from the teachings of the present disclosure.

Traditionally, the least reliable bits (LRBs) are selected by sorting all the received data. However, sorting the received data is expensive in hardware and may have a large latency if size of the codeword is large. Certain embodiments use an efficient method for selecting the least reliable bits. In one example, the least reliable bits are selected by comparing LLR values corresponding to one or more bits of the received data with a predetermined LLR threshold value. It should be noted the proposed method is not limited to decoding TPC codes and in general, can be used in any decoder that uses list decoding methods to select a number of candidates out of a plurality of candidates.

In one embodiment, the decoder may include one or more threshold LLR values. For example, the decoder may include three LLR threshold values t1, t2 and t3, in which t1<t2<t3. The decoder may first compare the received LLR values with the first threshold t1 to select N1 least reliable bits. If the number of selected least reliable bits (e.g., N1) is smaller than L, the decoder may then compare the received LLR values with a larger threshold value (e.g., the second threshold t2) to select more of the least reliable bits. In general, L represents the number of least reliable bits that the decoder intends to select.

Figure 7:
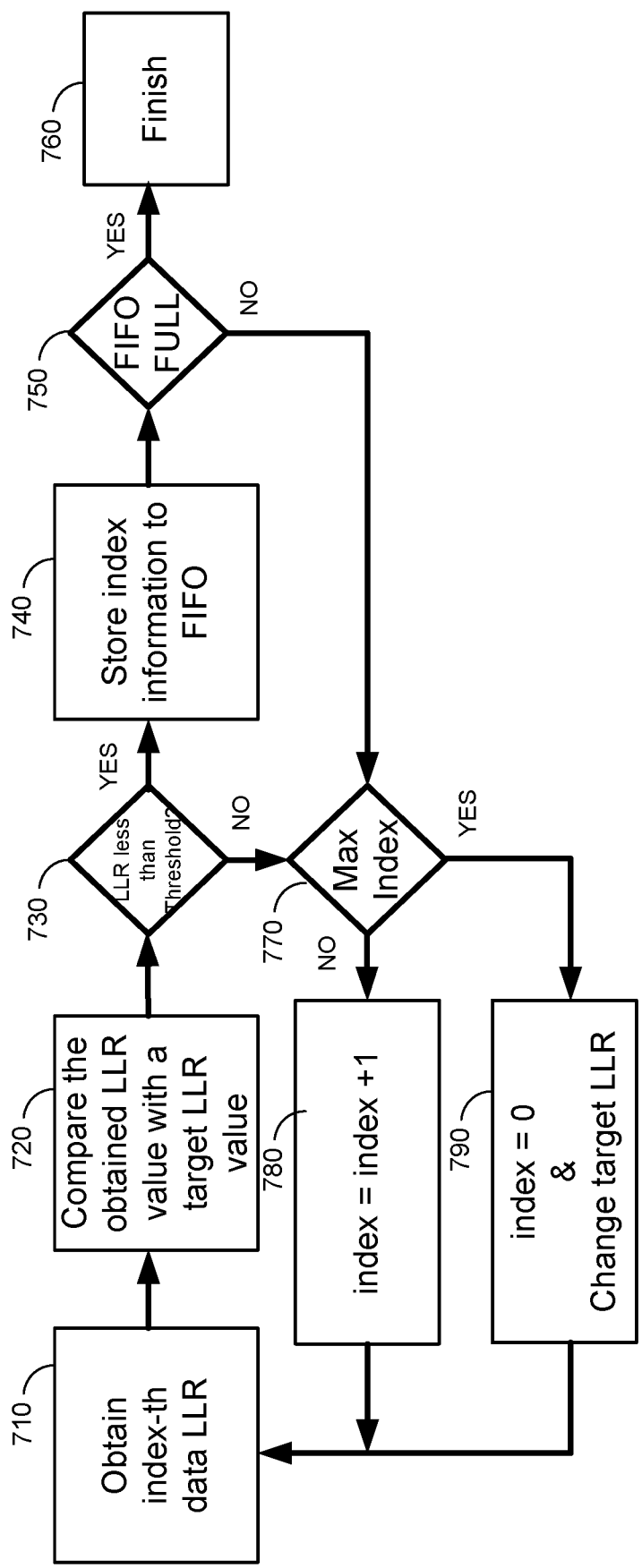
FIG. 7 illustrates an example flowchart for selecting L least reliable bits, in accordance with certain embodiments of the present disclosure.

FIG. 7 illustrates an example flow chart for selecting L least reliable bits, in accordance with certain embodiments of the present disclosure. It should be noted that although the flow chart illustrates the serial comparison case, the proposed method can be applied to semi-serial and/or parallel comparison without departing from the teachings of the present disclosure. At 710, the decoder obtains one or more LLR values corresponding to one or more data bits. As an example, the decoder receives an LLR value corresponding to the bit in the location equal to parameter index. At 720, the decoder compares the received LLR value with a target LLR value (e.g., a target threshold value). At 730, the decoder determines if the received LLR value is equal to or less than the target threshold value. If yes, the decoder determines that the corresponding bit is a good candidate for "least reliable bits." At 740, the decoder stores the index information into a first in first out (FIFO) buffer. At 750, the decoder checks whether it has found enough least reliable bits or not. In one example, the decoder may check if the FIFO is full or not. Any other method may also be used to check if enough bits are selected. For example, the decoder may want to select 10 least reliable bits. As soon as the decoder finds the 10$^{th}$ bit, the decoder may stop the process of least reliable bit selection (e.g., at 760) and move to the next step of the TPC decoding process (e.g., the bit flipping process).

If the decoder determines that more least reliable bits are still needed to be selected (e.g., number of selected LSBs<L), at 770, the decoder checks to see if it has searched all the bits in the codeword or not. If no, at 780, the decoder increases the index value by one and checks the next bit. At 790, if the decode has checked all the received bits and has not yet found enough least reliable bits (e.g., meaning that the threshold has been large), the decoder sets the target LLR threshold value to a smaller value and searches the received bits to see if it can find more least reliable bits. In one embodiment, the decoder may set index value to zero and start searching from the LLR values corresponding to first bit of the received message. In general, the decoder may start the search process from any other bit location in the codeword, without departing from the teachings of the present disclosure.

In one embodiment, when the decoder starts comparing the LLR values corresponding to the obtained bits with a smaller threshold, the decoder may only add the indexes that are not already in the FIFO to the list of selected least reliable bits.

In one embodiment, the general bit flipping block 570 is utilized to generate the flipped patterns based on the selected LRBs. In general, if L LRBs are selected, $2^L$ flipped patterns will be generated, in which L represents the number of least reliable bits. Performance of the decoding process improves with increasing values of L. In one embodiment, if a miscorrection protection scheme is used in the decoder, an increase in the number of least reliable bits improves the performance of the decoder. It should be noted that increasing L may result in an increase in the number of flipped patterns, which may increase hardware complexity.

The general bit flipping scheme as described herein may generate a predefined number of flipped patterns. In general, the number of flipped patterns may be independent from the number of least reliable bits L. In one embodiment, the flipped patterns may be generated by flipping at most S of the bits to generate each flipped pattern. The total number of flipped patterns can be written as follows:

$$\sum_{i=1}^{i=S} C_i^L$$

in which $C_i^L$ represents choosing i elements from a set of L elements (e.g., L Choose i).

In one embodiment, a general bit flipping block may be designed in hardware based on a $C_i^L$ flipping block. As an example, the $C_i^L$ flipping block may flip i out of L LRBs and find all the combinations. In one embodiment, by accessing $C_i^L$ flipping block S times and changing value of i, one by one from 1 to S, the general bit flipping block can go through all the combination of flipped patterns.

Figure 8:
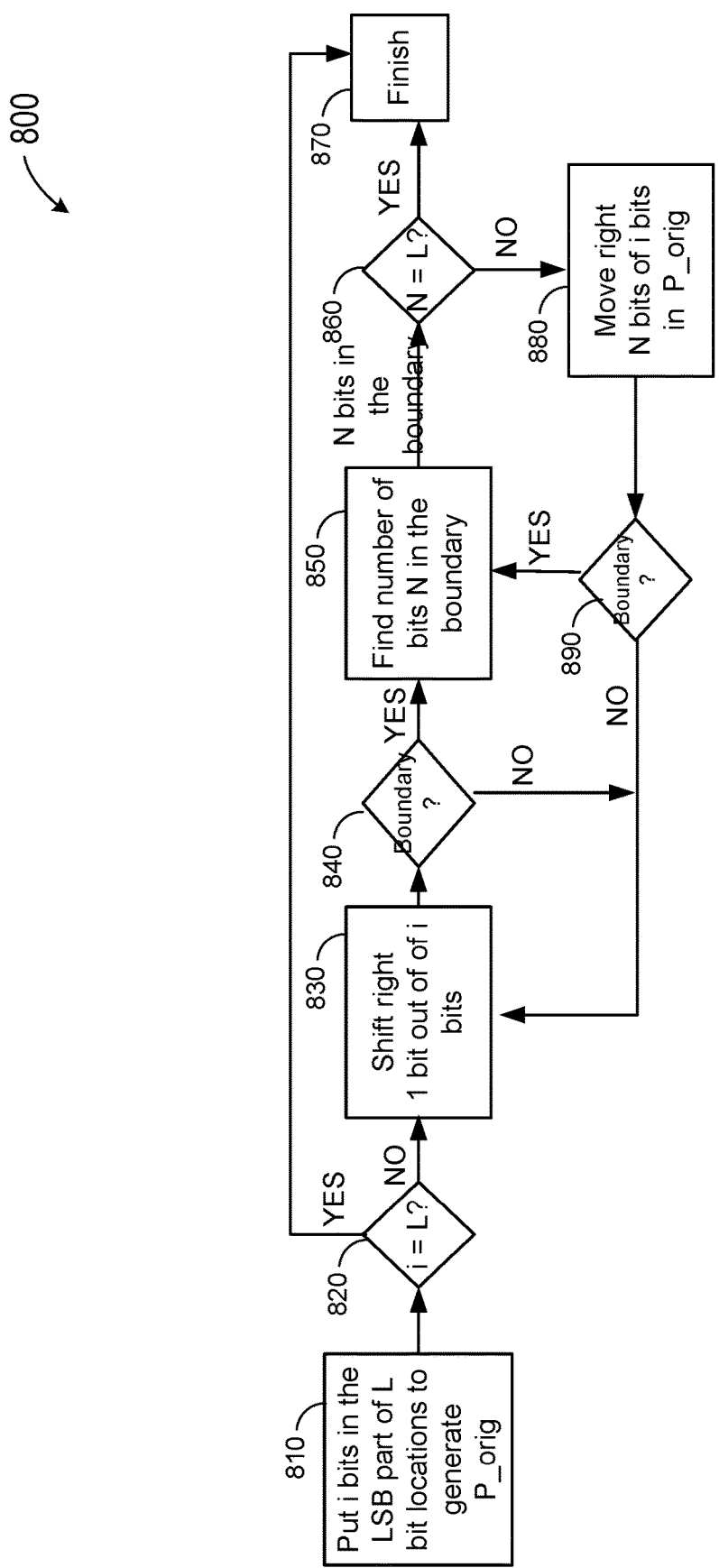
FIG. 8 illustrates an example flowchart for performing general bit flipping by a device, in accordance with certain embodiments of the present disclosure.

FIG. 8 illustrates an example flowchart for performing general bit flipping 700 by a device, corresponding to the GBF block 570 as shown in FIG. 5, in accordance with certain embodiments of the present disclosure. In this example, $C_i^L$ bits are flipped to generate flipped patterns. At 810, the device puts i bits in least significant bits out of L bit location to generate an original bit pattern $P_{orig}$. As an example, if i=3 and L=5, the device generates $P_{orig}$=11100. At 820, the device checks if i is equal to L. If yes, the device declares that all the bit patterns are found and stops this procedure. If I is smaller than L, at 830 the device shifts one bit out of the i bits in $P_{orig}$ to generate another pattern. As an example, the device generates pattern 11010. At 840, the device checks if the bit has reached the boundary. In the above example, the answer is No. In this case, the device at 830 generates another pattern (e.g., 11001). Since one of the bits has reached the boundary, at 850, the device finds the number of bits at the boundary (e.g., N). In the above example, only one of the bits has reached the rightmost boundary. Therefore, N=1. At 860, the device checks if N is equal to L or not. If yes, at 870, the device declares that it has found all the bit patterns and stops this procedure. If N is smaller than L, at 880, the device shifts N bits out of the i bits towards right. And at 890, the device checks if the bits have reached the boundary. In this example, the device generates patterns 10101 and 10011 at steps 830 through 850. In the latter case N=2, then the device moves two bits to the right from the $P_{orig}$ to generate 10110 at step 880. The device continues this procedure to generate other patterns (e.g., 01011, 00111, 01101 and 01110).

In general, performance of Chase decoding may be improved by increasing the maximum number of flipped bits in the bit flipping patterns. However, increasing the number of flipped bits may increase probability of miscorrection. In one embodiment, to reduce miscorrection probability, a miscorrection avoidance threshold is applied to the decoded patterns. In one example, a miscorrection metric may be defined for the decoder. As an example, the miscorrection metric may be generated by generating a summation of the difference between the received LLRs corresponding to each bit and the corresponding decoded bit in the decoded pattern. It should be noted that any other metric based on the received LLR and/or the decoded bits may be used for miscorrection avoidance without departing from the teachings of the present disclosure.

The miscorrection avoidance threshold may then be compared with a miscorrection metric to decide whether or not the decoder has miscorrected any of the bits.

Figure 9:
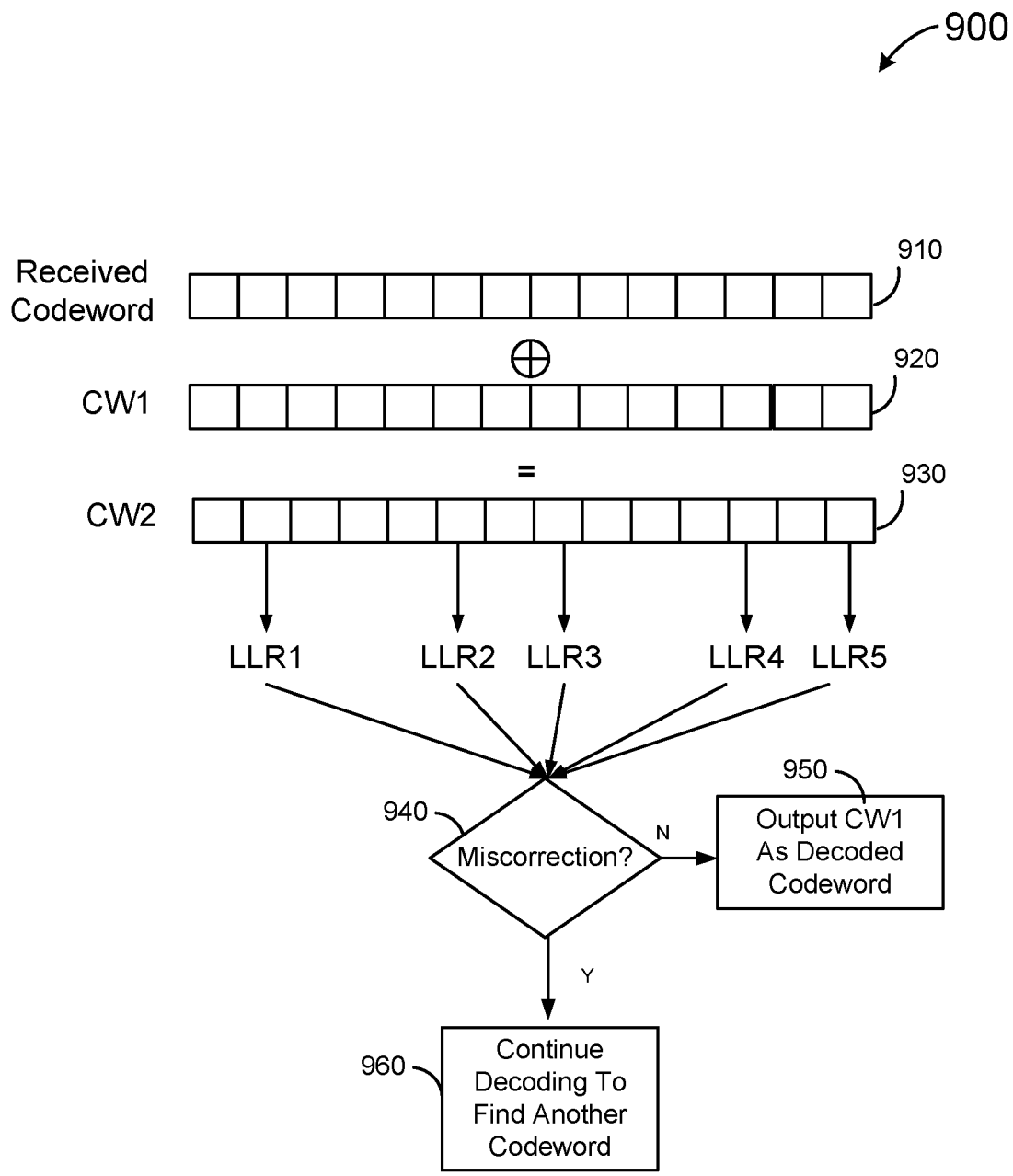
FIG. 9 illustrates a simple example for a novel miscorrection avoidance technique, in accordance with certain embodiments of the present disclosure.

FIG. 9 illustrates a simple example 900 for the miscorrection avoidance thresholding (e.g., MAT) technique as described herein. As illustrated, the received codeword 910 is compared with another codeword that is a result of flipping and/or decoding (e.g., CW1 920) to generate codeword CW2 930. Codeword CW2 shows locations in the received codeword that are modified by flipping and/or decoding. The LLR values corresponding to each location that is modified in CW2 (e.g., LLR values corresponding to a given bit in the received codeword whose corresponding bit value is different in CW1) are selected and added together, as follows:

$$M = \sum_{i=1}^{k} |LLR_k|$$

in which M represents a miscorrection metric, k represents the number of bits whose corresponding value is different between the two codewords, and LLR represents reliability of a given bit in the received codeword. At block 940, the miscorrection metric is compared with a miscorrection threshold. In one embodiment, if M is larger than the miscorrection threshold, a miscorrection is declared and the decoder at 960 continues the decoding with another bit flipping pattern to find another codeword. If the miscorrection metric M is smaller than the miscorrection threshold, at 950, the device declares that no miscorrection has happened and outputs the codeword CW1 as the decoded codeword.

In general, the decoding is successful only if the summation of the difference values (e.g., the miscorrection metric M) is smaller than the threshold value. In one embodiment, the decoded codeword is passed to the MAT block for the summation and comparison procedure. In general, there is no need to pass the flipped patterns to MAT block. In one embodiment, MAT block works based on the decoded codeword and the received codeword. The received codeword is the codeword that is sent to the Chase decoder. In one embodiment, XOR of the received codeword and the decoded codeword will identify the bits that are flipped by the Chase decoder. For example, the bits that are found through XOR operation will have both flipped patterns as well as BCH decoder flipping. In one embodiment, LLR at these mismatched locations is summed in absolute value and compared with the threshold value.

In general, value of the miscorrection threshold can be defined based on the channel conditions and/or other parameters of the system. In one embodiment, value of the MAT threshold is obtained through simulations. For example, for n=1023, k=993, m=10, t=3, BCH/Chase decoding can be done for multiple codewords using additive white Gaussian noise (AWGN) channel. For decoded codewords, the sum of miscorrection metric at flipped locations (L_sum) can be calculated. A histogram may then be plotted based on L_sum conditioned on the fact that the codeword is miscorrected or not. In simulations, it is observed that histograms for miscorrected and corrected codewords are almost disjoint except some minor tail region. In one embodiment, the value of L_sum is selected such that the histogram for miscorrected and histogram for corrected codewords are roughly separated. In one embodiment, it is observed that the value of the miscorrection threshold has minimal variations for different noise variances of AWGN channels that are in the range of interest.

There may be a tradeoff in performance of the decoder depending on the miscorrection avoidance threshold value. If a lower value is used as the miscorrection threshold, the device may detect all of the miscorrections and avoid them. However, the decoder may not allow correcting some codewords which are decoded correctly but do not satisfy the miscorrection threshold check. If a higher value is considered for the miscorrection threshold, the decoder may correctly decode codewords, but may not be able to detect all the miscorrections for some of the codewords, which may not be desirable.

In one embodiment, a lower value of miscorrection threshold may be used in the early decoding iterations and, as the decoding progresses, a higher value of miscorrection threshold can be used. This adaptive thresholding method can provide gains in the higher SNR regimes. In one embodiment, the values of adaptive miscorrection thresholds are determined according to the desired channel.

In general, LLR values that are lower correspond to the bits that are noisy, which are good candidates for being in error and would be flipped during decoding. A lower value of threshold means that the MAT is strict in terms of avoiding miscorrections because L_sum should be smaller than the miscorrection threshold for allowing flips. It is preferable to avoid miscorrections in the start of decoding since there are usually more bits in error at the start of the decoding. Therefore, in one embodiment, the threshold is chosen conservatively at an early stage of decoding. As decoding progresses, errors are removed. Therefore, a more lenient threshold (e.g., a higher value of threshold can be used in the decoding). As an example, a bit in error having an LLR value equal to 1.4, with an initial threshold equal to one, will not get flipped until the threshold is increased with iterations and becomes greater than 1.4. In one example, a lower threshold value (e.g., one) may be used at the beginning of decoding and a higher threshold value (e.g., 1.5) can be used after four decoding iterations.

The TPC soft decoder architecture presented herein utilizes a modified version of Chase decoding, which is more efficient in hardware. As described earlier, the decoder utilizes one or more optimization methods (least reliable bits selection, general bit flipping and/or miscorrection avoidance thresholding) to provide better error correcting performance with minimal increase in hardware complexity.

Figure 10:
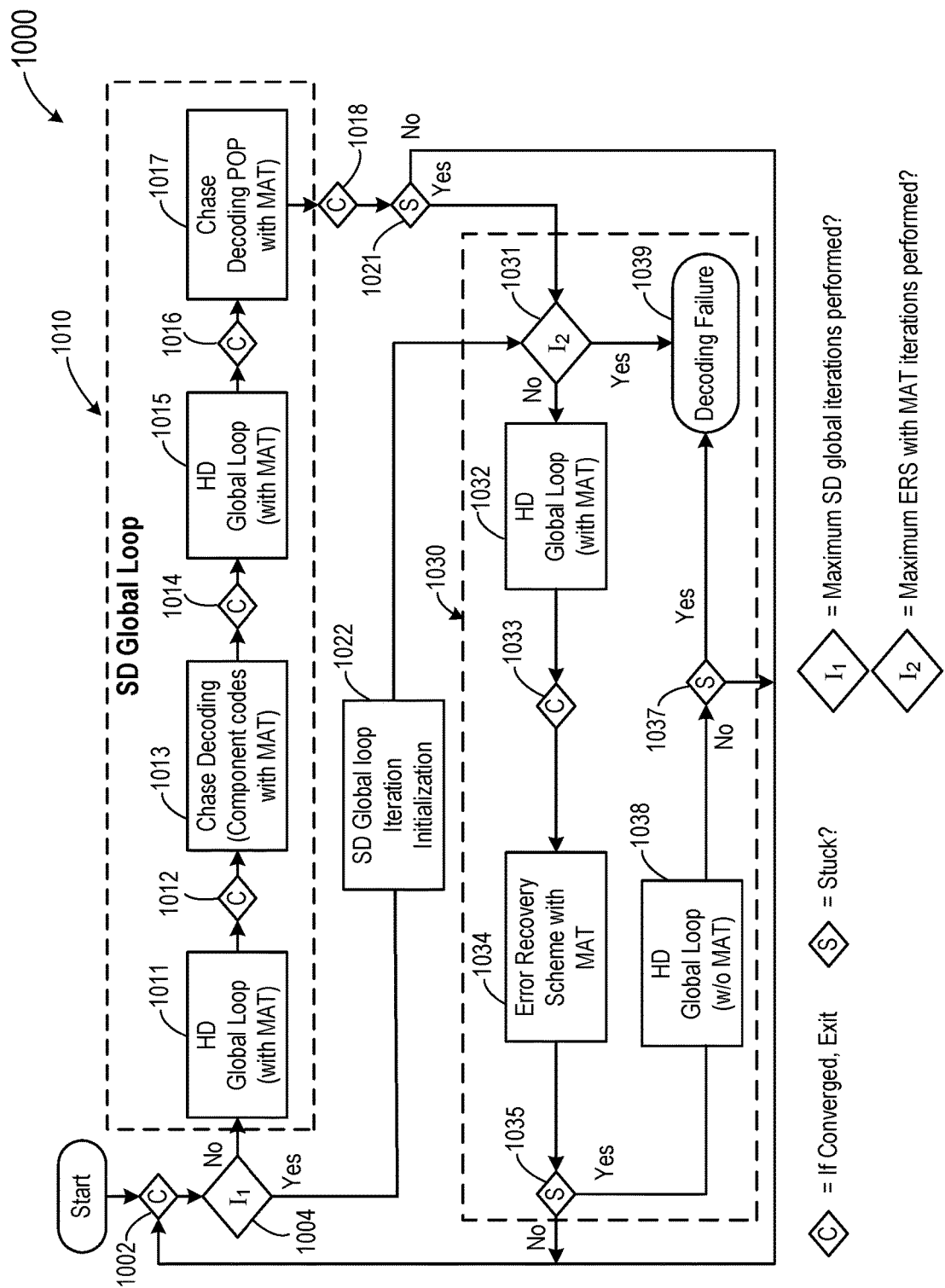
FIG. 10 is a block diagram illustrating an iterative soft decoder for a GPC according to an embodiment of the present disclosure.

FIG. 10 is a block diagram illustrating an iterative soft decoder for a GPC according to an embodiment of the present disclosure. Decoder 1000 is described below with reference to the GPC illustrated in FIG. 2H, which describes a product code, in which data is arranged in an array such that each data chunk is protected twice by constituent codes. XOR-E and XOR-O are parities calculated on all even and odd data chunks, respectively, and are also protected twice using constituent codes. There is also parity on parity (POP) code constructed for constituent code parities.

In some embodiments, the decoder is iterative and uses Chase decoding on constituent codewords and parity on parity (POP) codewords along with an error location estimate (ELE) block. The decoder uses XOR-O and XOR-E block information in flipping error bits while decoding the codeword using miscorrection avoidance thresholding (MAT). As described above in connection with FIG. 9, MAT can be used during decoding with flipped bits to avoid miscorrections. The bit flipping using XOR information and MAT bolster the Chase iterative decoding and can make the codeword decoding faster and more efficient.

In embodiments of the disclosure, as shown in FIG. 10, iterative decoding, block 1010 (SD Global Loop), is used for decoding product codes in both hard and soft decision decoding. In a single iteration of GPC hard decision decoding, HD global loop block with MAT 1011, the constituent data codewords are decoded first, followed by the decoding of POP codewords. In this block, hard decision decoding using miscorrection avoidance thresholding (MAT) is performed. An example of hard decoding is described above in connection with FIG. 3, and MAT is described above in connection with FIGS. 6 and 7. This hard decision process is repeated iteratively until the codeword is successfully decoded or maximum iterations are reached.

At convergence check block 1012 (C), the result of HD decoding loop 1011 is checked. If the syndromes of all constituent codewords are zero during decoding and XOR-E and XOR-O are satisfied, it is called a successful codeword decoding. This 'convergence to a GPC codeword' condition is checked in this block. The decoding process is ended after satisfying the above condition; otherwise, the decoding proceeds to soft decoding block 1013.

In soft decision decoding block 1013, the soft decoding of component data codewords is performed using Chase decoding with MAT. An example of Chase decoding with MAT is described above in connection to FIGS. 5-9.

At convergence check block 1014 (C), the result of Chase decoding with MAT block 1013 is checked. If the syndromes of all constituent codewords are zero during decoding and XOR-E and XOR-O are satisfied, it is considered a successful codeword decoding. This 'convergence to a GPC codeword' condition is checked in this block. The decoding process is ended after satisfying the above condition; otherwise, the decoding proceeds to hard decoding block 1015.

In block 1015, iterative hard decoding similar to block 1011 is performed on data codewords and POP codewords. The constituent data codewords are decoded first, followed by the decoding of POP codewords. This decoding process is similar to the process described above in connection with block 1011. This hard decision process is repeated iteratively until the codeword is successfully decoded or maximum iterations are reached.

At convergence check block 1016 (C), the result of HD decoding loop 1015 is checked. If the syndromes of all constituent codewords are zero during decoding and XOR-E and XOR-O are satisfied, it is considered a successful codeword decoding. The decoding process is ended after satisfying the above condition; otherwise, the decoding proceeds to soft decoding block 1017.

In block 1017, soft decoding of parity-on-parity (POP) codewords are performed using Chase decoding with MAT. This decoding process is similar to the process described above in connection with block 1013. However, in block 1017, POP codewords are decoded instead of constituent codewords.

At convergence check block 1018 (C), the result of iterative decoding loop 1010 is checked. If the syndromes of all constituent codewords are zero during decoding and XOR-E and XOR-O are satisfied, it is determined as a successful codeword decoding. The decoding process is ended after satisfying the above condition; otherwise, the decoding continues to a stuck check block 1021 (S).

Stuck check block 1021 (S) determines if decoding loop 1010 is stuck. It is verified if the syndromes of the constituent codewords have changed from previous stuck check. If so, then a stuck condition has not been reached, and the iteration of block 1010 (soft decode global loop) continues with convergence check block 1002 (C). If at stuck check block 1021 (S), the syndromes do not change and a stuck condition has been reached, the decoder enters an error recovery scheme 1030.

At convergence check block 1002 (C), the result of iterative decoding loop 1010 is checked. The decoding process is ended after successful decoding; otherwise, the decoding continues to an iteration loop check block 1004 ($I1$), which is a maximum soft decoding global iteration check. The maximum number of global soft decoding iterations can be specified in the decoder initialization. This block checks if the number of global soft decoding iterations has reached the maximum. If the maximum number of global soft decoding iterations has not been reached, the soft decision global loop 1010 continues with block 1011, the hard decision global loop. The maximum number of global soft decoding iterations has been reached, and the decoder enters block 1022, the soft decision global loop iteration initialization. In this block, the value of the loop count I1 is set to 0 so that Chase decoding can be triggered again. Next, the decoder enters an error recovery scheme 1030.

As described above, error recovery scheme (ERS) is invoked when the Iteration Check Condition 1004 ($I_1$) 1004 is met, or when the global soft decoding Stuck Condition 1021 (S) is met. ERS may be run multiple times during the decoding of a codeword up to a maximum value denoted by block 1031 ($I_2$), which performs maximum ERS with MAT iteration check. During decoder initialization, the maximum number of iterations of the error recovery scheme (ERS) with MAT iterations can be specified. In block 1031, the decoder checks if the number of iterations has reached the maximum value. If the maximum number of iterations has been reached and the decoding is still not successful, a decoding failure condition is reached (1039). If the maximum number of iterations has not been reached, error recovery scheme (ERS) 1030 continues.

As shown in FIG. 10, error recovery scheme (ERS) 1030 includes a hard decoding block 1032, error recovery scheme 1034, and another hard decoding block 1038. The ERS loop 1030 also includes a convergence check block 1033, a first stuck check block 1035, and a second stuck check block 1037.

Hard decoding block 1032 is a hard decoding global loop with MAT similar to the HD Global Loop 1011 in SD Global Loop 1010 described above. The constituent data codewords are decoded first, followed by the decoding of POP codewords. In this block, hard decision decoding using miscorrection avoidance thresholding (MAT) is performed. An example of hard decoding is described above in connection with FIG. 3, and MAT is described above in connection with FIGS. 6 and 7. This hard decision process is repeated iteratively until the codeword is successfully decoded or maximum iterations are reached.

At convergence check block 1033 (C), the result of HD decoding loop 1032 is checked. If the syndromes of all constituent codewords are zero during decoding and XOR-E and XOR-O are satisfied, then the codeword decoding is successful, and the decoding process is ended; otherwise, the decoding proceeds to error recovery scheme (ERS) block 1034.

In error recovery scheme (ERS) block 1034, soft decoding with bit flipping is performed. ERS block 1034 includes running flipping with data chunks and flipping with component codes parity regions. A method for bit flipping with data chunks is described below with reference to FIG. 11, and a method for bit flipping with parity regions is described below with reference to FIG. 12.

Next, a stuck check (1035) is performed. Stuck check block 1035 (S) determines if the decoding is stuck. It is verified if the syndromes of the constituent codewords have changed from a previous stuck check. If so, then a stuck condition has not been reached, and the method continues with convergence check block 1002 (C). If at stuck check block 1035 (S), the syndromes do not change, this indicates a stuck condition has been reached. Under this condition, the decoder enters a hard decision global loop 1038.

Hard decoding block 1038 is a hard decoding global loop without MAT. In some embodiments, the constituent data codewords are decoded first, followed by the decoding of POP codewords. An example of hard decoding is described above in connection with FIG. 3, and MAT is described above in connection with FIGS. 6 and 7. This hard decision process is repeated iteratively until the codeword is successfully decoded or maximum iterations are reached.

Next, a stuck check (1037) is performed. Stuck check block 1037 (S) determines if the decoding is stuck. It is verified if the syndromes of the constituent codewords have changed from previous stuck check. If so, then a stuck condition has not been reached, and the method continues with convergence check block 1002 (C). If at stuck check block 1037 (S), the syndromes do not change and a stuck condition has been reached, a decoding failure condition is reached (1039).

Under this condition, an error recovery scheme 1030 using information from the XOR blocks is started, including a hard decoding block 1031, error recovery scheme 1033, and another hard decoding block 1035.

Figure 11:
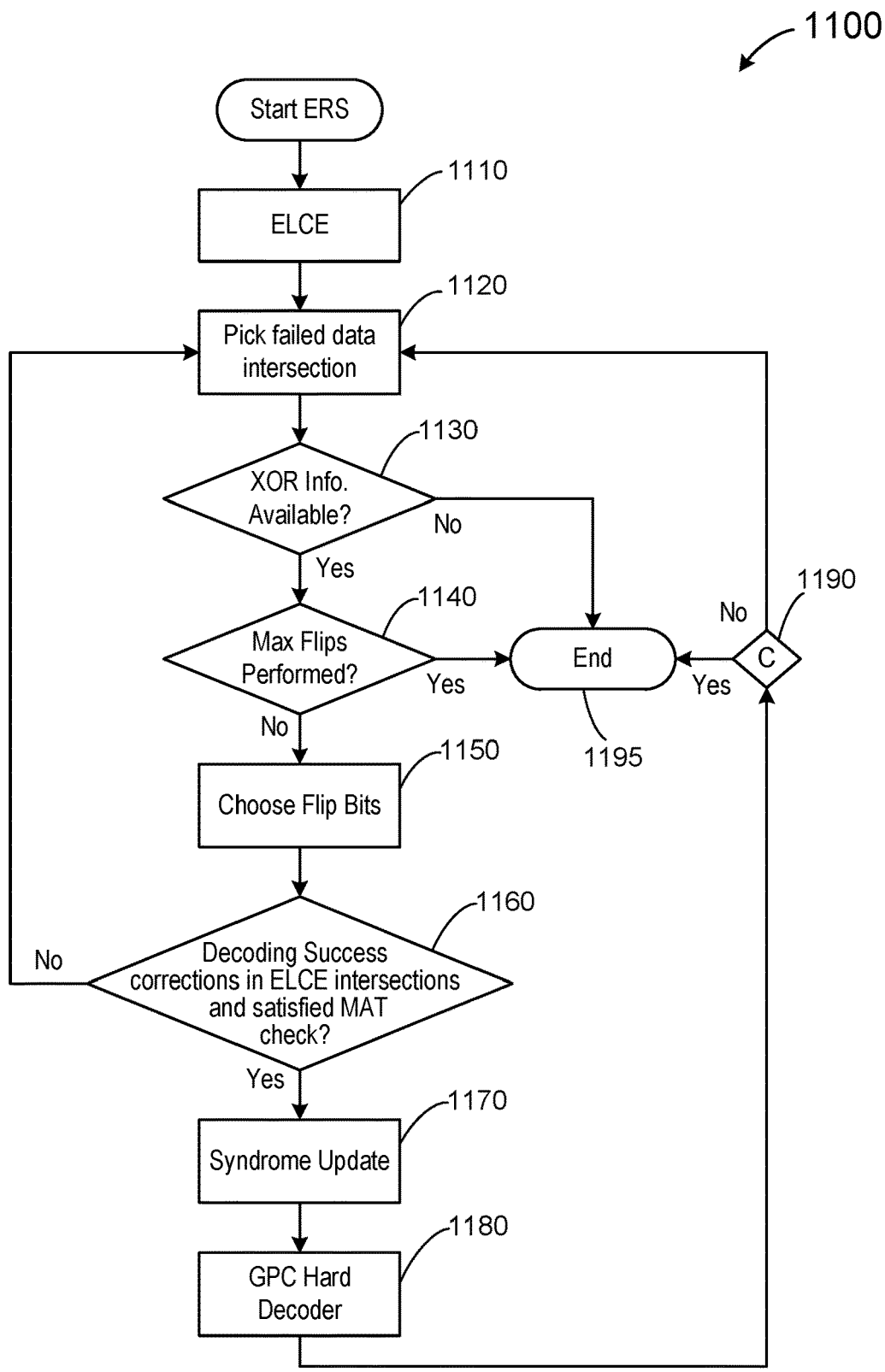
FIG. 11 is a flowchart showing the process of Enhanced Recovery Scheme (ERS) used in the GPC soft decoder of FIG. 10.

FIG. 11 is a flowchart showing the process Enhanced Recovery Scheme (ERS) 1034 used in the GPC soft decoder of FIG. 10. This flow illustrates an example for running flipping using XOR blocks on data intersections using BCH decoding with MAT. In this embodiment, a method for correcting an error in the data blocks includes determining a list of failed data codewords by including those data codewords having more corrections than a restricted error correction capability of the first error-correcting coding scheme, identifying potential failed data blocks based on shared blocks between failed data codewords, and identifying potential failed bits in failed data blocks using information from the blocks of XOR bits.

As shown in FIG. 11, a method 1100 for error correction of a GPS code includes error location chunks (block) estimation (ELCE) (1110). In this block, most probable data chunks containing errors are estimated. Since iterative GPC decoding is unsuccessful, there are some component codewords that failed during BCH decoding. It has been observed that miscorrection may occur in the hard decoder while decoding component codewords. In order to avoid these miscorrections, a restricted decoding is done on component codewords where the error correction capability of the component code (T) is traded off to increase the error detection capability. This helps the ELCE block to find failed component codewords and thus determine potential error locations. Let $T_R$ denote the restricted error correction capability such that $T_R<T$. During component BCH codewords decoding, all successful BCH decoding resulting in greater than $T_R$ corrections is declared as BCH decoding constituting failed BCH codewords. The list of failed component codewords obtained with restricted decoding can be used to determine a list of probable data chunks that can have errors as follows. From the construction of GPC, each data chunk is protected twice from two component codes. Let $N_f$ denote the failed number of component codewords. There will be $$\frac{N_f(N_f-1)}{2}$$

possible data intersections that can contain errors. Along similar lines, all POP component codewords failing can provide possible data chunks in parity that can have errors. This observation on POP component codewords failures is used in error location chunks estimation (ELCE) in decoding method 1200 described below in connection with FIG. 12.

In FIG. 11, method 1100 for error correction of a GPS code includes the XOR flipper on data chunks. XOR for all even and odd data chunks is stored on the NAND to correct stuck error patterns. These XOR chunks provide possible error locations across all failed error intersections. ELCE block provides the most probable data chunks with errors. On these possible chunks, bits can be flipped using the XOR blocks information. For example, if there are two component codewords failing, there will be one intersection corresponding to these failed component codewords. This intersection can be corrected through XOR blocks. If there are 3 component codewords failing, the number of possible error location chunks is 3. On each of these 3 possible error location chunks, bits are flipped using XOR chunk information. Let $L_E$ and $L_O$ denote error locations for even and odd XOR chunks. First, $$\binom{L_E}{1} \text{ or } \binom{L_O}{1}$$

locations can be flipped on each possible odd or even data intersection respectively and BCH decoding using MAT is done after flipping. If BCH decoding using MAT is successful, all corrections are committed only when corrections are made in the chunks in the list provided by ELCE. This flipping can be performed by flipping 2 out of $L_E$ bits at time, then 3 bits, up to all $L_E$ bits, resulting in $$\binom{L_E}{2}, \binom{L_E}{3}, \dots, \binom{L_E}{L_E}$$

possible flipping patterns. This flipping strategy can also be performed with the odd blocks. In some embodiments, one bit is flipped on even and odd block as described above. Then two bits are flipped on even and odd blocks, and then three bits are flipped, and so on. In practice, a complexity requirement is put on the amount of flipping bits done on all possible error location chunks that will determine the amount of flipping done during this recovery procedure.

The method described above is summarized in the flowchart of FIG. 11. As shown in FIG. 11, method 1100 includes error location chunks estimation (ELCE) (1110). The method includes picking failed data intersections (1120), and checking if XOR information is available (1130). If no such information is available, then this method ends (1195). If XOR information is available, the bit flipping is performed. First, the number of maximum flips is checked (1140), and if the maximum number of flips has been performed, the method ends (1195). If the maximum number of flips has not been reached, the method includes choosing flip bits to perform bit flipping (1150). The method includes determining if the bit flipping results in successful decoding with corrections in ELEC intersections and miscorrection avoidance (1160). If the decoding is not successful, the method continues to pick failed data intersections (1120) for additional flipping opportunities. If the decoding is successful, the syndrome is updated (1170), and hard decoding is performed (1180). The method also includes a convergence check (1190). Convergence check block 1190 is similar to the convergence check blocks described above in connection with FIG. 10, e. g., 1012, 1014, 1016, and 1018, etc. In convergence check 1190, the result of the decoding loop is checked. If the syndromes of all constituent codewords are zero during decoding and XOR-E and XOR-O are satisfied, then it is determined as a successful codeword decoding. If convergence check 1190 determines that the decoding is not successful, then method 1100 continues to pick failed data intersections (1120) for additional flipping opportunities. If convergence check 1190 determines that the decoding is successful, then method 1100 ends (1195).

Figure 12:
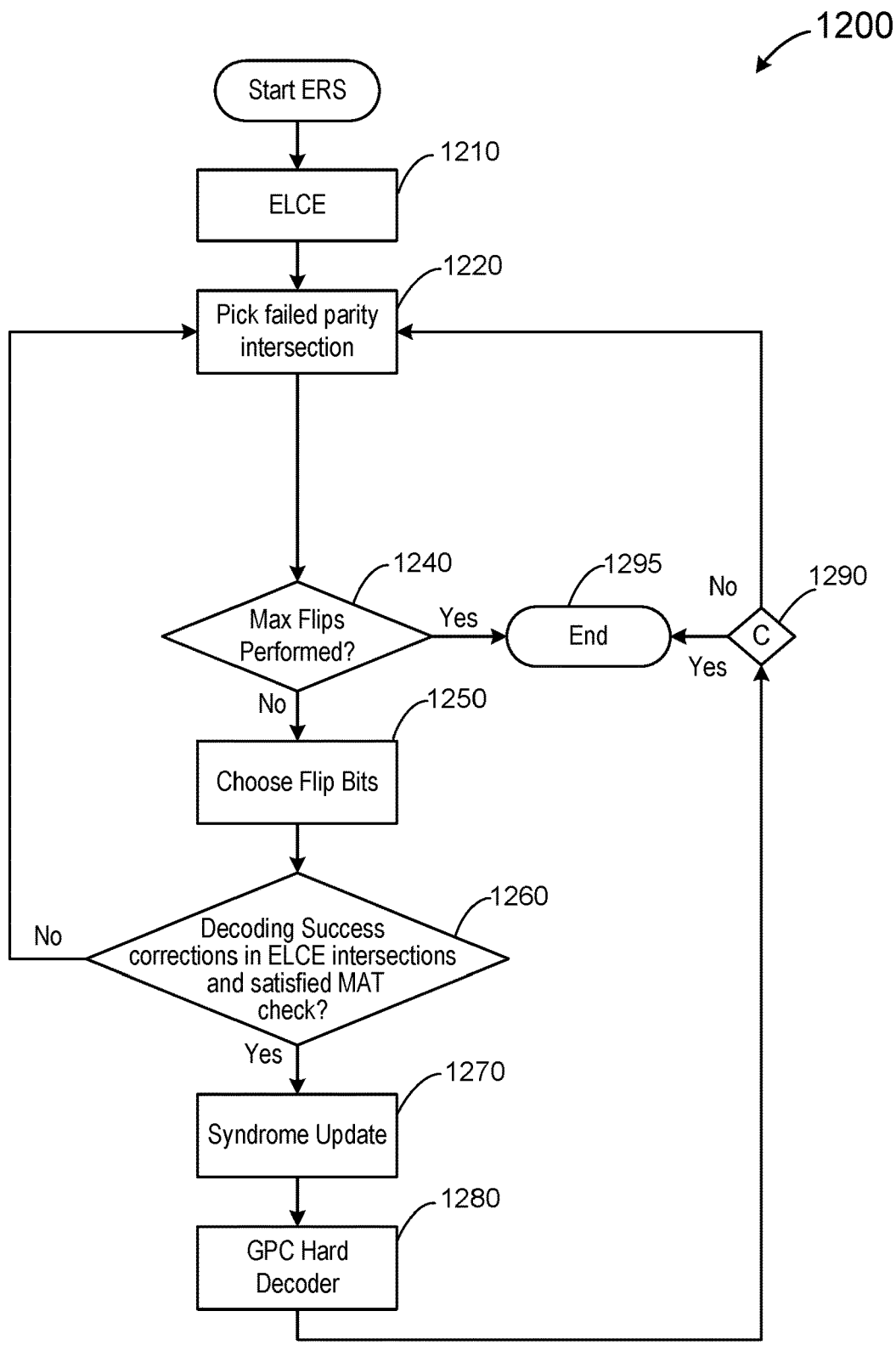
FIG. 12 is a flowchart showing the flipping step used in Enhanced Recovery Scheme for flipping bits in the component codes parity region in the GPC soft decoder of FIG. 10.

FIG. 12 is a flowchart showing the flipping step used in the Enhanced Recovery Scheme for flipping bits in the component codes parity region in the GPC soft decoder of FIG. 10. Possible error location chunks in parity can be found using failed POP codewords, similar to using failed component codewords described above in connection with FIG. 11. However, there is no XOR information stored for parity that enforces usage of all possible patterns varying from $$\begin{pmatrix} I_p \\ 1 \end{pmatrix} \text{ to } \begin{pmatrix} I_p \\ I_p \end{pmatrix},$$

where $I_p$ denotes the number of parity bits taken from all component code parities in order to construct a POP codeword. If the value of $I_p$ is large, all possible flipping is not done in this flipper, and the amount of flipping can be determined according to complexity requirement.

In some embodiments, a method for correcting stuck errors in the POP blocks includes determining a list of failed pop codewords by including those POP codewords having more corrections than a restricted error correction capability of the second error-correcting coding scheme, and identifying potential failed parity blocks based on failed data codewords and failed POP codewords.

The method described above is summarized in the flowchart of FIG. 12. As shown in FIG. 12, method 1200 includes error location chunks estimation (ELCE) (1210), which is similar to error location chunks estimation (ELCE) (1110) described above in connection with FIG. 11.

Method 1200 also includes picking failed parity intersections (1220) for performing bit flipping. First, the number of maximum flips is checked (1240), and if the maximum number of flips has been performed, the method ends (1295). If the maximum number of flips has not been reached, the method includes choosing flip bits to perform bit flipping (1250). The method includes determining if the bit flipping results in successful decoding with corrections in ELEC intersections and miscorrection avoidance (1260). If the decoding is not successful, the method continues to pick failed data intersections (1220) for additional flipping opportunities. If the decoding is successful, the syndrome is updated (1270), and hard decoding is performed (1280). For example, in some embodiments, BCH decoding is done using MAT after flipping probable errors to avoid miscorrections.

The method also includes a convergence check (1290). Convergence check block 1290 is similar to the convergence check blocks described above in connection with FIG. 10. In convergence check 1290, the result of the decoding loop is checked. If the syndromes of all constituent codewords are zero during decoding and XOR-E and XOR-O are satisfied, then it is determined as a successful codeword decoding. If convergence check 1290 determines that the decoding is not successful, then method 1200 continues to pick failed parity intersections (1220) for additional flipping opportunities. If convergence check 1290 determines that the decoding is successful, then method 1200 ends (1295).

The embodiments disclosed herein are not to be limited in scope by the specific embodiments described herein. Various modifications of the embodiments of the present disclosure, in addition to those described herein, will be apparent to those of ordinary skill in the art from the foregoing description and accompanying drawings. Further, although some of the embodiments of the present disclosure have been described in the context of a particular implementation in a particular environment for a particular purpose, those of ordinary skill in the art will recognize that its usefulness is not limited thereto and that the embodiments of the present disclosure can be beneficially implemented in any number of environments for any number of purposes.

Figure 13:
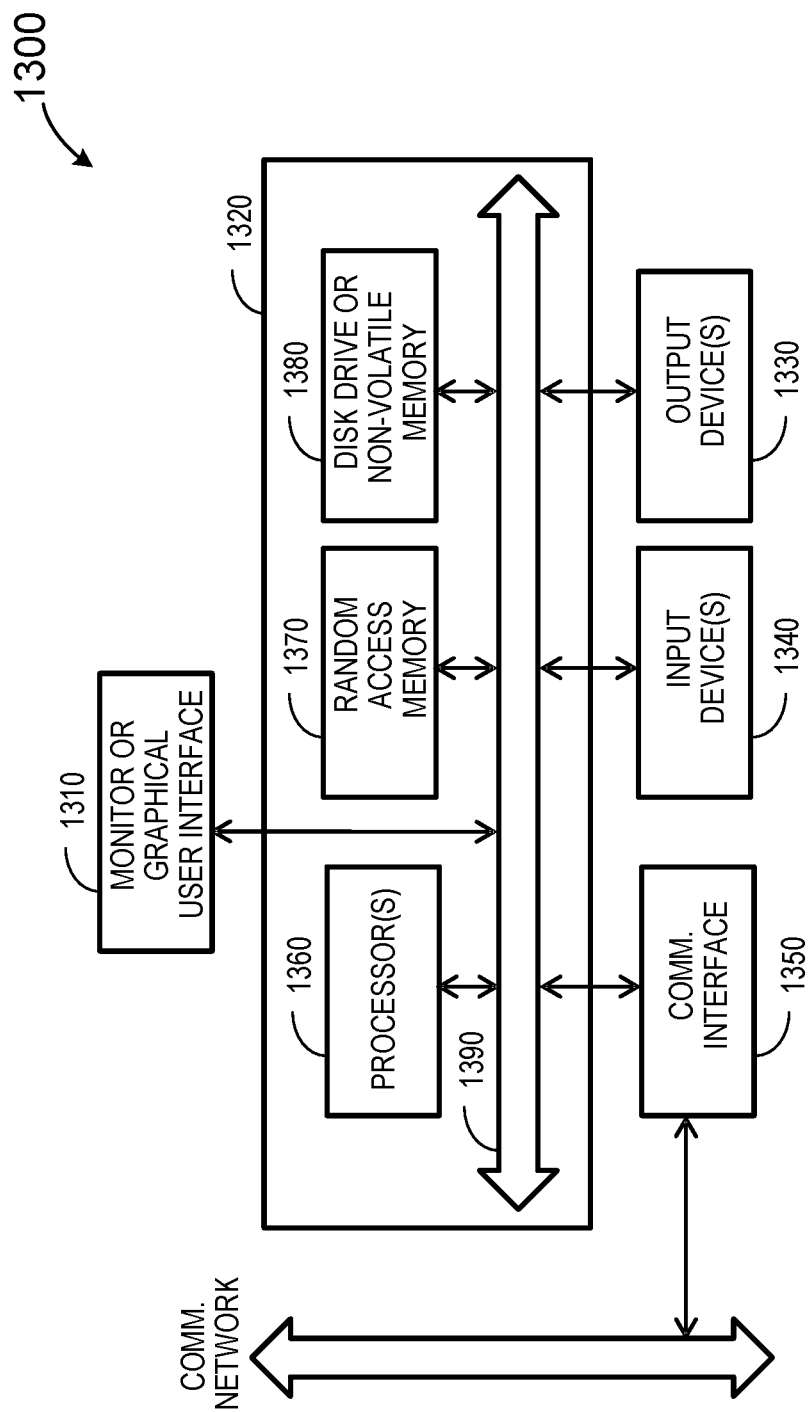
FIG. 13 is a simplified block diagram illustrating an apparatus that may be used to implement various embodiments according the present disclosure.

FIG. 13 is a simplified block diagram illustrating an apparatus that may be used to implement various embodiments according the present disclosure. FIG. 13 is merely illustrative of an embodiment incorporating the present disclosure and does not limit the scope of the disclosure as recited in the claims. One of ordinary skill in the art would recognize other variations, modifications, and alternatives. In one embodiment, computer system 1300 typically includes a monitor 1310, a computer 1320, user output devices 1330, user input devices 1340, communications interface 1350, and the like.

As shown in FIG. 13, computer 1320 may include a processor(s) 1360 that communicates with a number of peripheral devices via a bus subsystem 1390. These peripheral devices may include user output devices 1330, user input devices 1340, communications interface 1350, and a storage subsystem, such as random access memory (RAM) 1370 and disk drive 1380.

User input devices 1340 can include all possible types of devices and mechanisms for inputting information to computer system 1320. These may include a keyboard, a keypad, a touch screen incorporated into the display, audio input devices such as voice recognition systems, microphones, and other types of input devices. In various embodiments, user input devices 1340 are typically embodied as a computer mouse, a trackball, a track pad, a joystick, wireless remote, drawing tablet, voice command system, eye tracking system, and the like. User input devices 1340 typically allow a user to select objects, icons, text and the like that appear on the monitor 1310 via a command such as a click of a button or the like.

User output devices 1330 include all possible types of devices and mechanisms for outputting information from computer 1320. These may include a display (e.g., monitor 1310), non-visual displays such as audio output devices, etc.

Communications interface 1350 provides an interface to other communication networks and devices. Communications interface 1350 may serve as an interface for receiving data from and transmitting data to other systems. Embodiments of communications interface 1350 typically include an Ethernet card, a modem (telephone, satellite, cable, ISDN), (asynchronous) digital subscriber line (DSL) unit, FireWire interface, USB interface, and the like. For example, communications interface 1350 may be coupled to a computer network, to a FireWire bus, or the like. In other embodiments, communications interfaces 1350 may be physically integrated on the motherboard of computer 1320, and may be a software program, such as soft DSL, or the like.

In various embodiments, computer system 1300 may also include software that enables communications over a network such as the HTTP, TCP/IP, RTP/RTSP protocols, and the like. In alternative embodiments of the present disclosure, other communications software and transfer protocols may also be used, for example IPX, UDP or the like. In some embodiments, computer 1320 includes one or more Xeon microprocessors from Intel as processor(s) 1360. Further, one embodiment, computer 1320 includes a UNIX-based operating system.

RAM 1370 and disk drive 1380 are examples of tangible storage media configured to store data such as embodiments of the present disclosure, including executable computer code, human readable code, or the like. Other types of tangible storage media include floppy disks, removable hard disks, optical storage media such as CD-ROMS, DVDs and bar codes, semiconductor memories such as flash memories, read-only-memories (ROMS), battery-backed volatile memories, networked storage devices, and the like. RAM 1370 and disk drive 1380 may be configured to store the basic programming and data constructs that provide the functionality of the present disclosure.

Software code modules and instructions that provide the functionality of the present disclosure may be stored in RAM 1370 and disk drive 1380. These software modules may be executed by processor(s) 1360. RAM 1370 and disk drive 1380 may also provide a repository for storing data used in accordance with the present disclosure.

RAM 1370 and disk drive 1380 may include a number of memories including a main random access memory (RAM) for storage of instructions and data during program execution and a read only memory (ROM) in which fixed non-transitory instructions are stored. RAM 1370 and disk drive 1380 may include a file storage subsystem providing persistent (non-volatile) storage for program and data files. RAM 1370 and disk drive 1380 may also include removable storage systems, such as removable flash memory.

Bus subsystem 1390 provides a mechanism for letting the various components and subsystems of computer 1320 communicate with each other as intended. Although bus subsystem 1390 is shown schematically as a single bus, alternative embodiments of the bus subsystem may utilize multiple busses.

FIG. 13 is representative of a computer system capable of embodying the present disclosure. It will be readily apparent to one of ordinary skill in the art that many other hardware and software configurations are suitable for use with the present disclosure. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A memory device, comprising:
a memory array;
a processor coupled to the memory array and configured to read encoded data from the memory array, wherein the encoded data includes a group of data bits arranged in data blocks, the data blocks including information blocks of information bits and one or more XOR blocks of XOR bits, the XOR bits formed by exclusive OR operation on the information bits, the encoded data being encoded in a product code into a plurality of data codewords, and each data codeword including a number of data blocks, wherein each data block is included in two or more data codewords, and data codewords belonging to a same pair of data codewords share a common data block; and
a decoding apparatus configured to:
iteratively decode the data codewords using hard decoding and soft decoding to determine failed data codewords; and
correct stuck errors by identifying failed data blocks based on shared common data blocks between failed data codewords, and, in the shared common data blocks, flip failed bits identified from decoding the one or more XOR blocks.

2. The memory device of claim 1, wherein the encoded data comprises:
a plurality of data codewords, each data codeword including a number of data blocks and a parity block having a number of parity bits, and the parity bits are formed by encoding the data blocks using a first error-correcting coding scheme; and
one or more parity-on-parity (POP) codewords formed by encoding the parity bits of the data codewords using a second error-correcting coding scheme.

3. The memory device of claim 2, wherein the decoding apparatus is configured to iteratively decode the data codewords by:
first hard decoding of the data codewords and the POP codewords;
soft decoding of the data codewords;
second hard decoding of the data codewords and the POP codewords; and
soft decoding of the POP codewords.

4. The memory device of claim 2, wherein the decoding apparatus is configured to correct stuck errors by:

correcting stuck errors in the POP codewords by identifying failed parity blocks based on failed data codewords and failed POP codewords.

5. The memory device of claim 4, wherein correcting stuck errors in the data blocks comprises:
determining a list of failed data codewords by including, in the list, those data codewords having more corrections than allowed by a restricted error correction capability of the first error-correcting coding scheme;
identifying potential failed data blocks based on shared blocks between failed data codewords;
identifying potential failed bits in failed data blocks using information from the XOR blocks of XOR bits; and
flipping one or more potential failed bits.

6. The memory device of claim 4, wherein correcting stuck errors in the POP codewords comprises:
determining a list of failed POP codewords by including, in the list, those POP codewords having more corrections than allowed by a restricted error correction capability of the second error-correcting coding scheme;
identifying potential failed parity blocks based on failed data codewords and failed POP codewords; and
flipping one or more potential failed bits.

7. A method for decoding data, the method comprising:
reading encoded data from a memory array, wherein the encoded data includes a group of data bits arranged in data blocks, the data blocks including information blocks of information bits and one or more XOR blocks of XOR bits, the XOR bits formed by exclusive OR operation on the information bits, the encoded data being encoded in a product code into a plurality of data codewords and each data codeword including a number of data blocks, wherein each data block is included in two or more data codewords, wherein data codewords belonging to a same pair of data codewords share a common data block;
iteratively decoding the data codewords using hard decoding and soft decoding to determine failed data codewords; and
correcting stuck errors by identifying failed data blocks based on shared common data blocks between failed data codewords in the iterative decoding, and, in the shared common data blocks, flipping failed bits identified from decoding the one or more XOR blocks.

8. The method of claim 7, wherein the encoded data comprises:
a plurality of data codewords, each data codeword including a number of data blocks and a parity block having a number of parity bits, the parity bits formed by encoding the data blocks using a first error-correcting coding scheme; and
one or more parity-on-parity (POP) codewords formed by encoding the parity bits of the data codewords using a second error-correcting coding scheme.

9. The method of claim 8, wherein iteratively decoding data codewords comprises:
first hard decoding of the data codewords and the POP codewords;
soft decoding of the data codewords;
second hard decoding of the data codewords and the POP codewords; and
soft decoding of the POP codewords.

10. The method of claim 8, wherein the method further comprises:
correcting stuck errors in the POP codewords by identifying failed parity blocks based on failed data codewords and failed POP codewords.

* * * * *